(12) United States Patent
Shin et al.

(10) Patent No.: US 11,676,904 B2
(45) Date of Patent: Jun. 13, 2023

(54) SEMICONDUCTOR PACKAGE

(71) Applicant: Samsung Electronics Co., Ltd., Suwon-si (KR)

(72) Inventors: Jiwon Shin, Daejeon (KR); Donguk Kwon, Asan-si (KR); Kwang Bok Woo, Cheonan-si (KR); Minseung Ji, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 25 days.

(21) Appl. No.: 17/328,297

(22) Filed: May 24, 2021

(65) Prior Publication Data

US 2022/0045010 A1    Feb. 10, 2022

(30) Foreign Application Priority Data

Aug. 6, 2020   (KR) .................. 10-2020-0098717

(51) Int. Cl.
*H01L 23/538*    (2006.01)
*H01L 25/065*    (2023.01)
(Continued)

(52) U.S. Cl.
CPC ........ *H01L 23/5385* (2013.01); *H01L 23/367* (2013.01); *H01L 24/16* (2013.01);
(Continued)

(58) Field of Classification Search
CPC ..... H01L 23/538; H01L 23/367; H01L 24/16; H01L 24/32; H01L 24/48; H01L 24/73; H01L 25/0657; H01L 2224/16227; H01L 2224/32225; H01L 2224/48147; H01L 2224/73204; H01L 2224/73257;
(Continued)

(56) References Cited

U.S. PATENT DOCUMENTS

| 8,552,540 B2 | 10/2013 | Warren et al. |
| 9,269,646 B2 | 2/2016 | Luo et al. |

(Continued)

FOREIGN PATENT DOCUMENTS

| KR | 100792352 B1 | 1/2008 |
| KR | 101423388 B1 | 7/2014 |
| KR | 101546123 B1 | 8/2015 |

*Primary Examiner* — Jasmine J Clark
(74) *Attorney, Agent, or Firm* — Muir Patent Law, PLLC

(57) ABSTRACT

A semiconductor package includes a first sub-semiconductor device, an interposer, and a second sub-semiconductor device stacked on each other, and a heat sink covering the second sub-semiconductor device. The first sub-semiconductor device includes a first substrate and a first semiconductor chip. The interposer includes a dielectric layer, a thermal conductive layer in contact with a bottom surface of the dielectric layer, a first thermal conductive pad in contact with a top surface of the dielectric layer, and thermal conductive vias penetrating the dielectric layer to connect the thermal conductive layer to the first thermal conductive pad. A bottom surface of the thermal conductive layer is adjacent to and connected to a top surface of the first semiconductor chip. The second sub-semiconductor device is disposed on the dielectric layer without overlapping the first thermal conductive pad. The heat sink further covers the first thermal conductive pad to be connected thereto.

20 Claims, 29 Drawing Sheets

(51) Int. Cl.
*H01L 23/00* (2006.01)
*H01L 23/367* (2006.01)

(52) U.S. Cl.
CPC ............. *H01L 24/32* (2013.01); *H01L 24/48* (2013.01); *H01L 24/73* (2013.01); *H01L 25/0657* (2013.01); *H01L 2224/16227* (2013.01); *H01L 2224/32225* (2013.01); *H01L 2224/48147* (2013.01); *H01L 2224/73204* (2013.01); *H01L 2224/73257* (2013.01); *H01L 2224/73265* (2013.01); *H01L 2225/0651* (2013.01); *H01L 2225/0652* (2013.01); *H01L 2225/06506* (2013.01); *H01L 2225/06517* (2013.01); *H01L 2225/06562* (2013.01); *H01L 2924/15156* (2013.01); *H01L 2924/15311* (2013.01); *H01L 2924/3511* (2013.01)

(58) Field of Classification Search
CPC ... H01L 2225/0651; H01L 2225/06562; H01L 2924/15156; H01L 2924/15311; H01L 2924/3511

See application file for complete search history.

(56) References Cited

U.S. PATENT DOCUMENTS

| | | |
|---|---|---|
| 9,343,442 B2 | 5/2016 | Chen et al. |
| 9,397,080 B2 | 7/2016 | Hsu et al. |
| 9,698,132 B1 | 7/2017 | Ady et al. |
| 10,616,992 B2 | 4/2020 | Chen et al. |
| 2010/0255634 A1 | 10/2010 | Park et al. |
| 2015/0115467 A1* | 4/2015 | Park .................. H01L 23/3128 174/251 |
| 2018/0041003 A1 | 2/2018 | Dominguez et al. |
| 2020/0075567 A1 | 3/2020 | Collins |

* cited by examiner

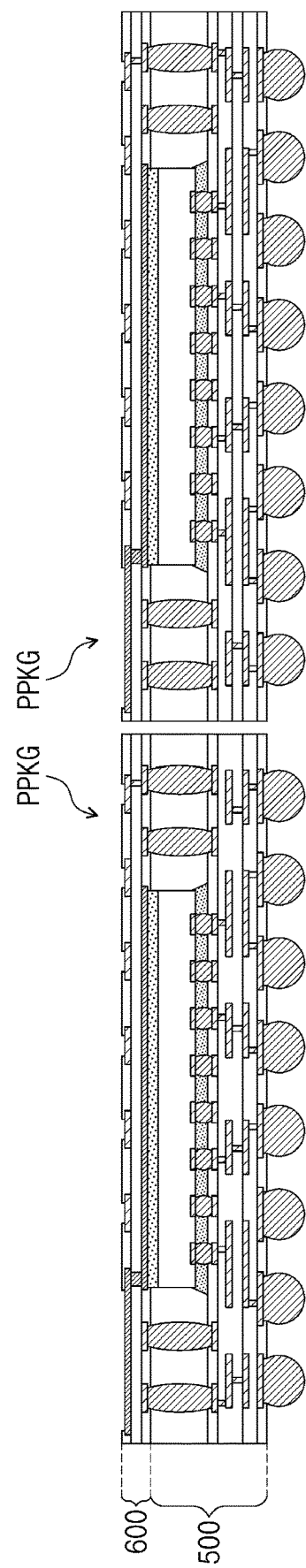

SEMICONDUCTOR PACKAGE

CROSS-REFERENCE TO RELATED APPLICATION

This U.S. nonprovisional application claims priority under 35 U.S.C § 119 to Korean Patent Application No. 10-2020-0098717 filed on Aug. 6, 2020 in the Korean Intellectual Property Office, the disclosure of which is hereby incorporated by reference in its entirety.

BACKGROUND

The present inventive concepts relate to a semiconductor package.

A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the printed circuit board. With the development of electronic industry, many studies have been conducted to improve reliability and durability of semiconductor packages.

SUMMARY

Some example embodiments of the present inventive concepts provide a semiconductor package with improved performance.

Some example embodiments of the present inventive concepts provide a wiring structure capable of providing enhanced thermal radiation.

An object of the present inventive concepts is not limited to the mentioned above, and other objects which have not been mentioned above will be clearly understood to those skilled in the art from the following description.

According to an embodiment of the present inventive concept, a semiconductor package includes a first sub-semiconductor device, an interposer, and a second sub-semiconductor device that are stacked on each other so that the interposer is configured to connect the first sub-semiconductor device and the second sub-semiconductor device with each other, and a heat sink covering the second sub-semiconductor device. The first sub-semiconductor device includes a first substrate and a first semiconductor chip that is stacked on the first substrate. The interposer includes a dielectric layer, a thermal conductive layer in contact with a bottom surface of the dielectric layer, a first thermal conductive pad in contact with a top surface of the dielectric layer, and a plurality of thermal conductive vias that penetrate the dielectric layer and connect the thermal conductive layer to the first thermal conductive pad. A bottom surface of the thermal conductive layer is adjacent to and connected to a top surface of the first semiconductor chip. The second sub-semiconductor device is disposed on the dielectric layer of the interposer without overlapping the first thermal conductive pad of the interposer. The heat sink further covers the first thermal conductive pad of the interposer to be connected thereto.

According to an example embodiment of the present inventive concept, a semiconductor package includes a first sub-semiconductor device, an interposer on the first sub-semiconductor device, a first thermal interface material layer between the first sub-semiconductor device and the interposer, a second sub-semiconductor device on the interposer, the second sub-semiconductor device exposing a portion of the interposer, a heat sink that covers a top surface of the second sub-semiconductor device, a sidewall of the second sub-semiconductor device and the portion of the interposer, and a second thermal interface material layer between the heat sink and the portion of the interposer. The first sub-semiconductor device includes a first substrate and a first semiconductor chip that is stacked on the first substrate. The interposer includes a dielectric layer, a thermal conductive layer in contact with a bottom surface of the dielectric layer, a thermal conductive pad in contact with a top surface of the dielectric layer, and a plurality of thermal conductive vias that penetrate the dielectric layer and connect the thermal conductive layer to the thermal conductive pad. The second sub-semiconductor device exposes the thermal conductive pad of the interposer. The first thermal interface material layer is in contact with a bottom surface of the thermal conductive layer and a top surface of the first semiconductor chip. The second thermal interface material layer is in contact with a top surface of the thermal conductive pad and the bottommost surface of the heat sink. The thermal conductive pad has a width having a value from about 500 µm to about 7,000 µm.

According to an embodiment of the present inventive concept, a semiconductor package includes a first sub-semiconductor device, an interposer, and a second sub-semiconductor device that are stacked on each other so that the interposer is configured to connect the first sub-semiconductor device and the second sub-semiconductor device with each other. The interposer includes a dielectric layer, a thermal conductive layer and a plurality of lower conductive patterns that are in contact with a bottom surface of the dielectric layer and are spaced apart from each other, a bottom surface of the thermal conductive layer being adjacent to and connected to a top surface of the first sub-semiconductor device, a thermal conductive pad and a plurality of upper conductive patterns that are in contact with a top surface of the dielectric layer and are spaced apart from each other, a plurality of thermal conductive vias that penetrate the dielectric layer and connect the thermal conductive layer to the thermal conductive pad, and a plurality of circuit vias that penetrate the dielectric layer. Each of the plurality of circuit vias connects a corresponding one of the plurality of upper conductive patterns to a corresponding one of the plurality of lower conductive patterns. The second sub-semiconductor device is disposed on the dielectric layer of the interposer without overlapping the thermal conductive pad of the interposer. A first width, in a first direction parallel to the bottom surface of the dielectric layer, of each of the plurality of thermal conductive vias is greater than a second width, in the first direction, of each of the plurality of circuit vias.

According to an embodiment of the present inventive concept, an interposer includes a dielectric layer, a thermal conductive layer and a plurality of lower conductive patterns that are in contact with a bottom surface of the dielectric layer and are spaced apart from each other, a thermal conductive pad and a plurality of upper conductive patterns that are in contact with a top surface of the dielectric layer and are spaced apart from each other, a plurality of thermal conductive vias that penetrate the dielectric layer and connect the thermal conductive layer to the thermal conductive pad, and a plurality of circuit vias that penetrate the dielectric layer. Each of the plurality of circuit vias connects a corresponding one of the plurality of upper conductive patterns to a corresponding one of the plurality of lower conductive patterns. A first width, in a first direction parallel to the bottom surface of the dielectric layer, of each of the plurality of thermal conductive vias is greater than a second width, in the first direction, of each of the plurality of circuit vias.

BRIEF DESCRIPTION OF THE DRAWINGS

FIGS. 5A to 5E illustrate cross-sectional views showing a method of fabricating a semiconductor package of FIG. 2.

DETAILED DESCRIPTION OF EMBODIMENTS

Some example embodiments of the present inventive concepts will now be described in detail with reference to the accompanying drawings to aid in clearly explaining the present inventive concepts.

Figure 1:
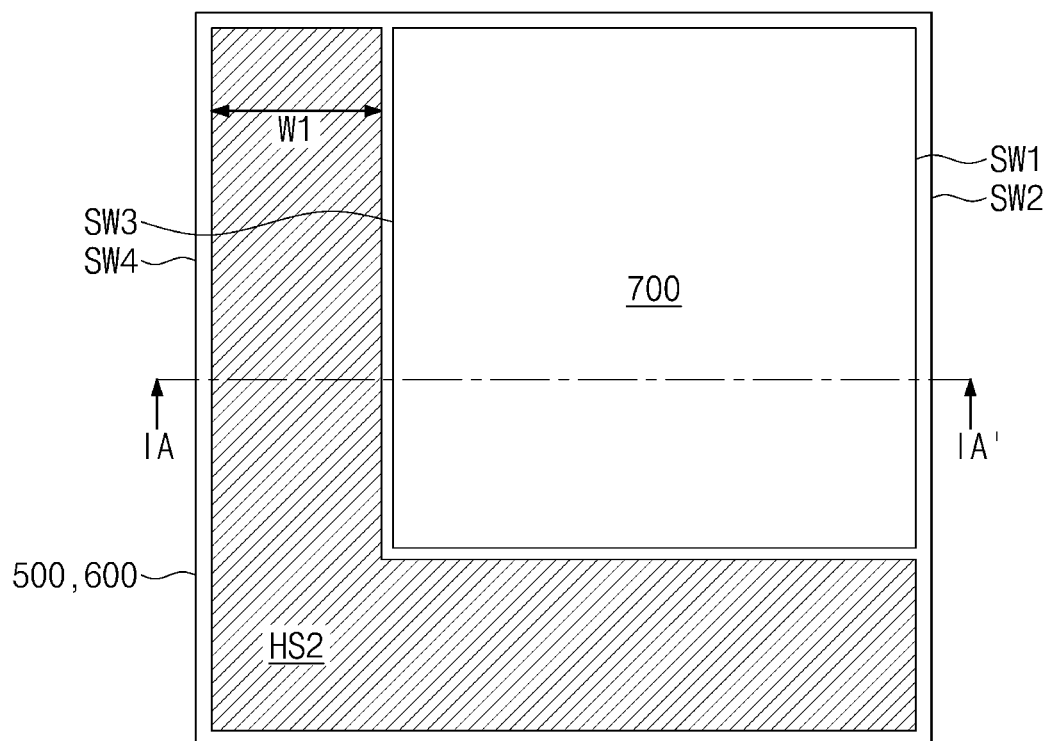
FIG. 1 illustrates a plan view showing a semiconductor package according to some example embodiments of the present inventive concepts.
Figure 2:
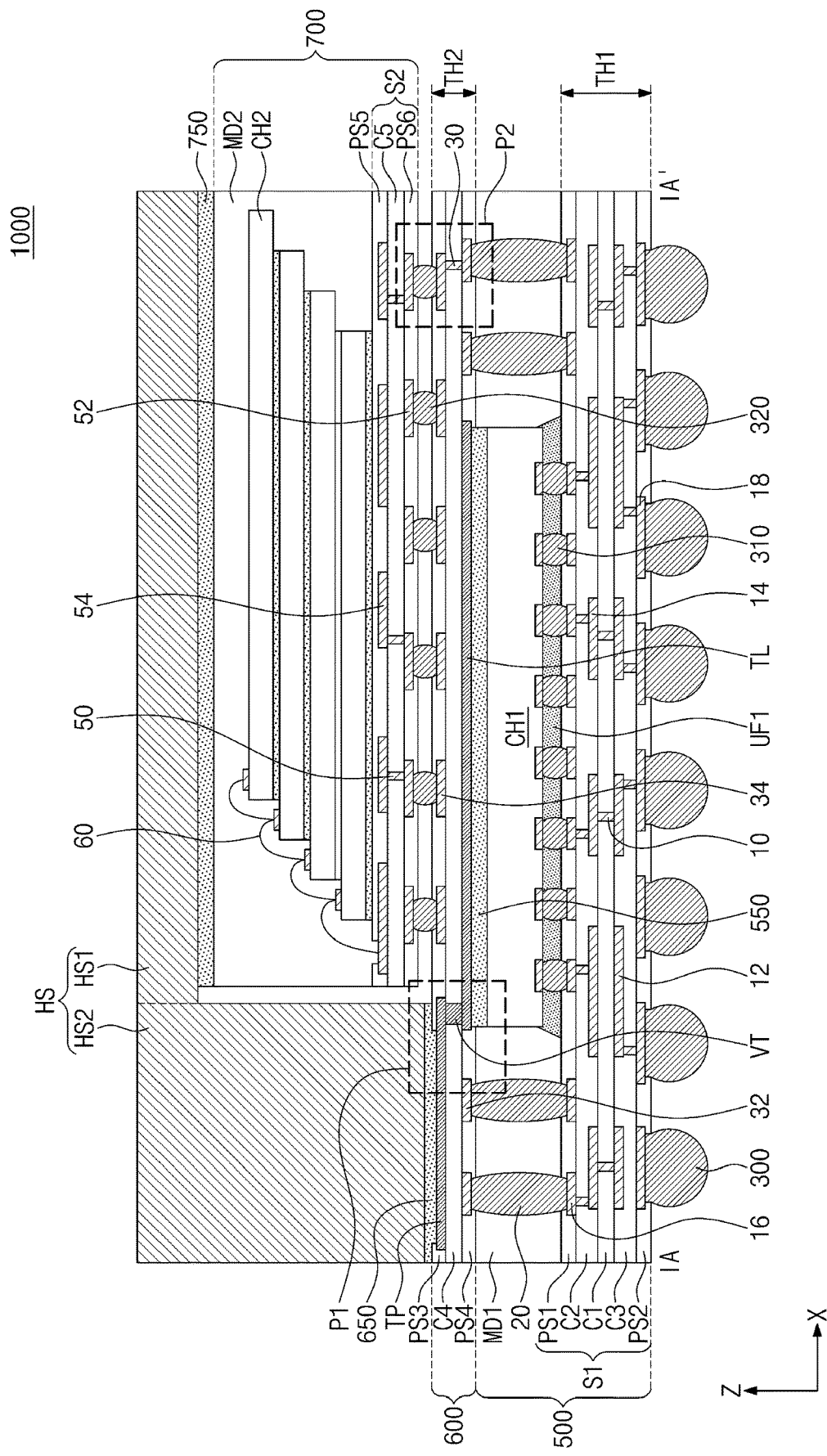
FIG. 2 illustrates a cross-sectional view taken along line IA-IA' of FIG. 1.

FIG. 1 illustrates a plan view showing a semiconductor package according to some example embodiments of the present inventive concepts. FIG. 2 illustrates a cross-sectional view taken along line IA-IA' of FIG. 1.

Referring to FIGS. 1 and 2, a semiconductor package 1000 according to some example embodiments may include a first sub-semiconductor package 500 (i.e., a first sub-semiconductor device), a wiring structure 600 (i.e., an interposer), a second sub-semiconductor package 700 (i.e., a second sub-semiconductor device), and a thermal radiation member HS (i.e., a heat sink) that are sequentially stacked on each other. The first sub-semiconductor package 500 and the wiring structure 600 may have the same width in a first direction X. The first sub-semiconductor package 500 and the wiring structure 600 may have their sidewalls that are aligned with each other. The second sub-semiconductor package 700 may have a width less than that of the wiring structure 600 in the first direction X. The second sub-semiconductor package 700 may have a first sidewall SW1 aligned with a first sidewall SW2 of the wiring structure 600. The second sub-semiconductor package 700 may have a second sidewall SW3 spaced apart from a second sidewall SW4 of the wiring structure 600. The second sub-semiconductor package 700 may expose a portion of the wiring structure 600. The first sidewall SW1 of the second sub-semiconductor package 700 and the second sidewall SW3 thereof may be opposite to each other in the first direction X. The first sidewall SW2 of the wiring structure 600 and the second sidewall SW4 thereof may be opposite to each other in the first direction X. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The thermal radiation member HS may include or may be formed of a material, such as metal (such as aluminum and copper) or graphene, whose thermal conductivity is high such that the thermal radiation member HS may serve as a heat sink of the semiconductor package 1000. The thermal radiation member HS may include a first thermal radiation part HS1 (i.e., a first heat sink part) that overlaps the second sub-semiconductor package 700 and a second thermal radiation part HS2 (i.e., a second heat sink part) that extends toward the wiring structure 600 from a sidewall of the first thermal radiation part HS1. The first and second thermal radiation parts HS1 and HS2 may be integrally united with each other, and no boundary may be present therebetween. The second thermal radiation part HS2 may be thicker than the first thermal radiation part HS1. In the present embodiment, the second thermal radiation part HS2 may have an "L" shape when the semiconductor package 1000 is viewed in a plan view, as shown in FIG. 1. The second thermal radiation part HS2 may have a first width W1 in the first direction X. The first width W1 may have a value, for example, from about 500 µm to about 7,000 µm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first sub-semiconductor package 500 may include a first substrate S1, a first semiconductor apparatus CH1 (i.e., a first semiconductor chip) mounted on the first substrate S1, and a first mold layer MD1 that covers a sidewall of the first semiconductor apparatus CH1. The first substrate S1 may have a first thickness TH1. The wiring structure 600 may have a second thickness TH2. The second thickness TH2 may be less than the first thickness TH1. The first substrate S1 may be, for example, a multi-layered printed circuit board. The first substrate S1 may include a first body layer C1, a second body layer C2, and a third body layer C3. Each of the first, second, and third body layers C1, C2, and C3 may include or may be formed of a dielectric material. For example, each of the first, second, and third body layers C1, C2, and C3 may be formed of a thermosetting resin such as an epoxy resin, a thermoplastic resin such as polyimide, or a resin in which a thermosetting or thermoplastic resin is impregnated with (or mixed with) a reinforcement element which is formed of, for example, glass fiber and/or inorganic filler. In an embodiment, the resin mixed with the reinforcement element may include a prepreg, a fire resist-4 (FR4), or a photosensitive resin, but the present inventive concepts are not limited thereto.

The second body layer C2 may be positioned above the first body layer C1, and the third body layer C3 may be positioned below the first body layer C1. The first body layer C1 may include first internal lines 14 on a top surface thereof, and may also include second internal lines 12 on a bottom surface thereof. First upper conductive patterns 16 may be disposed on the second body layer C2, and first lower conductive patterns 18 may be disposed on a bottom surface of the third body layer C3. A first upper passivation layer PS1 may be disposed on the second body layer C2, and the first upper conductive patterns 16 may be exposed on the second body layer C2. A first lower passivation layer PS2 may be disposed below the third body layer C3, and the first lower conductive patterns 18 may be exposed below the third body layer C3. First circuit vias 10 may be disposed in the first, second, and third body layers C1, C2, and C3, and the first and second internal lines 14 and 12 and the first upper and lower conductive patterns 16 and 18 may be electrically connected to each other through the first circuit vias 10. The first upper and lower passivation layers PS1 and PS2 may be a photosensitive solder resist (PSR) layer. External connection terminals 300 may be bonded to the first lower conductive patterns 18. The external connection terminals 300 may include or may be formed of one or more of solder balls, conductive bumps, and conductive pillars. The external connection terminals 300 may include or may be formed of one or more of tin, lead, aluminum, gold, and nickel.

The first semiconductor apparatus CH1 (i.e., a semiconductor chip) may be a single semiconductor die, or a semiconductor package that includes a single semiconductor die, or a plurality of semiconductor dies of the same type or different types. As used herein, the semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include at least one semiconductor chip, a redistribution layer which allows the input/output pads of an integrated circuit in other locations of the semiconductor chip, a package substrate, or an encapsulant formed on the package substrate and covering the semiconductor chip. The semiconductor device may be one selected from an image sensor chip such as CMOS image sensor (CIS), a microelectromechanical system (MEMS) device chip, an application specific integrated circuit (ASIC) chip, and a memory device chip such as Flash memory, DRAM, SRAM, EEPROM, PRAM, MRAM, ReRAM, HBM (high bandwidth memory), and HMC (hybrid memory cubic). The first semiconductor apparatus CH1 may be flip-chip bonded through first internal connection members 310 to the first upper conductive patterns 16 of the first substrate S1. The first internal connection members 310 may include or may be formed of one or more of solder balls, conductive bumps, and conductive pillars. A first under-fill layer UF1 may be interposed between the first semiconductor apparatus CH1 and the first substrate S1. The first under-fill layer UF1 may include or may be formed of a thermo-curable resin or a photo-curable resin. The first under-fill layer UF1 may further include an organic filler or an inorganic filler.

The first mold layer MD1 may cover the sidewall of the first semiconductor apparatus CH1 and a top surface of the first substrate S1. The first mold layer MD1 may include or may be formed of a dielectric resin, for example, an epoxy molding compound (EMC). The first mold layer MD1 may further include fillers, and the fillers may be dispersed in the dielectric resin.

Figure 3A:
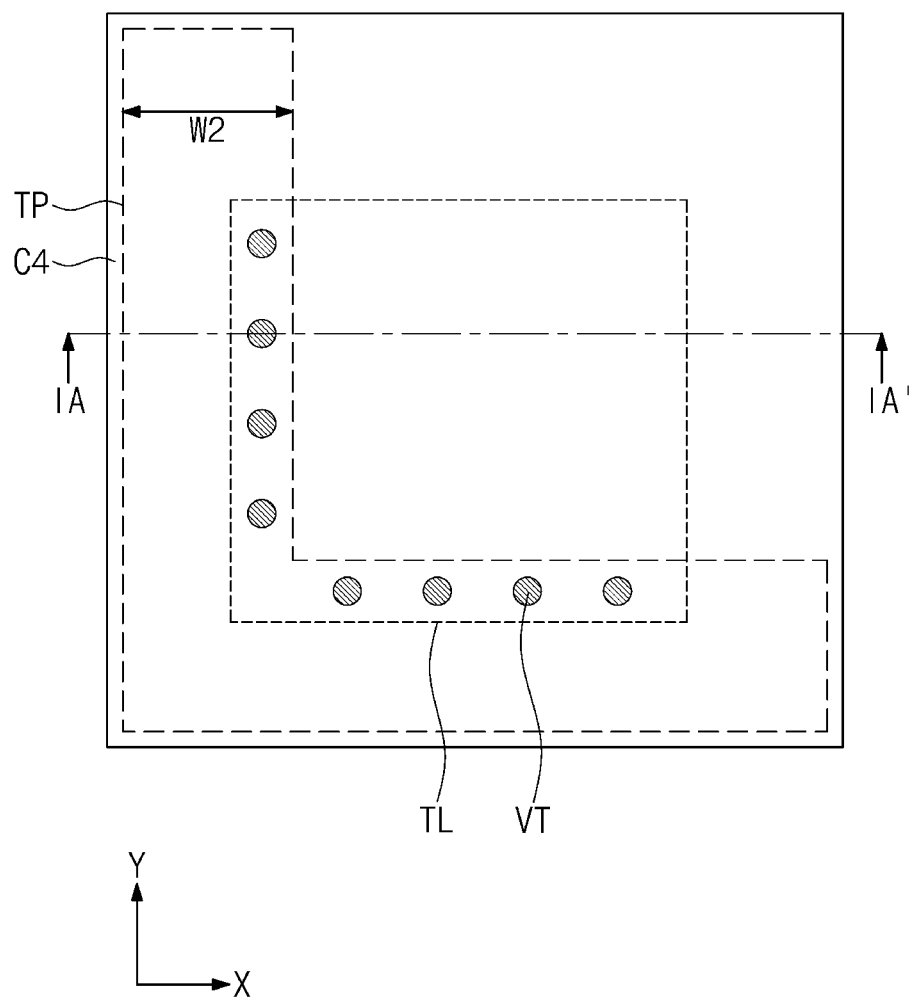
FIG. 3A illustrates a plan view showing a wiring structure according to some example embodiments of the present inventive concepts.
Figure 3B:
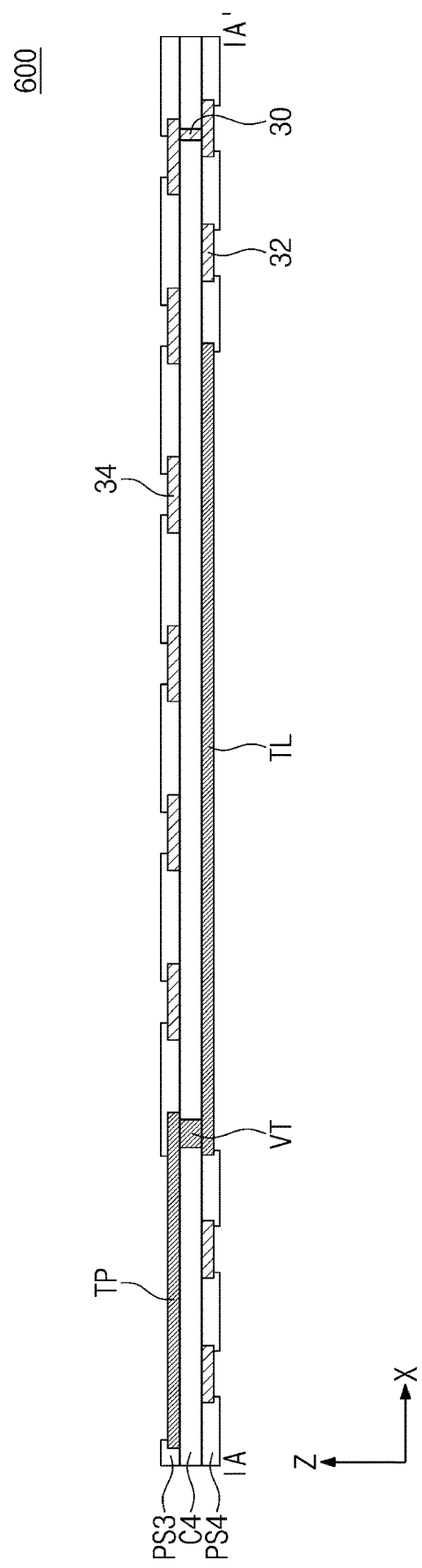
FIG. 3B illustrates a cross-sectional view taken along line IA-IA' of FIG. 3A.

FIG. 3A illustrates a plan view showing a wiring structure according to some example embodiments of the present inventive concepts. FIG. 3B illustrates a cross-sectional view taken along line IA-IA' of FIG. 3A.

Referring to FIGS. 1, 2, 3A, and 3B, the wiring structure 600 may be a double-sided printed circuit board. For example, the wiring structure 600 may include a fourth body layer C4, second upper conductive patterns 34 on a top surface of the fourth body layer C4, and second lower conductive patterns 32 on a bottom surface of the fourth body layer C4. Second circuit vias 30 may penetrate the fourth body layer C4, and may electrically connect the second upper conductive patterns 34 to the second lower conductive patterns 32. The fourth body layer C4 may include or may be formed of, for example, a material which is the same as or similar to that of the first body layer C1. Alternatively, the fourth body layer C4 may include or may be formed of silicon. In the present embodiment, the wiring structure 600 may be an interposer which is an electrical interface for spreading a connection to a wider pitch or for rerouting a connection to a different connection. In an embodiment, the wiring structure 600 may be a printed circuit board (PCB) interposer, and the body layer of the wiring structure 600 may be formed of a dielectric layer. The present invention is not limited thereto. For example, the wiring structure 600 may be a silicon interposer of which a body layer is formed of silicon.

The wiring structure 600 may further include a thermal conductive layer TL disposed on the bottom surface of the fourth body layer C4, a thermal conductive pad TP disposed on the top surface of the fourth body layer C4, and a thermal conductive via VT that penetrates the fourth body layer C4 and connects the thermal conductive layer TL to the thermal conductive pad TP. A second upper passivation layer PS3 may be disposed on the fourth body layer C4, exposing the thermal conductive pad TP and the second upper conductive patterns 34 which are disposed on the top surface of the fourth body layer C4. A second lower passivation layer PS4 may be disposed on the bottom surface of the fourth body layer C4, exposing the thermal conductive layer TL and the second lower conductive patterns 32 which are disposed on the bottom surface of the fourth body layer C4. The second upper and lower passivation layers PS3 and PS4 may include or may be formed of the same material as that of the first upper and lower passivation layers PS1 and PS2. The thermal conductive pad TP, the thermal conductive via VT, and the thermal conductive layer TL may constitute a thermal conductive structure through which heat generated from the first semiconductor apparatus CH1 may be transferred to the thermal radiation member HS (i.e., a heat sink). With the thermal conductive structure and the thermal radiation member HS, heat generated from the first semiconductor apparatus CH1 may be dissipated away to a fluid medium such as air or a liquid coolant, thereby allowing regulation of the temperature of the first semiconductor apparatus CH1.

The thermal conductive layer TL may vertically overlap the thermal conductive pad TP. The thermal conductive pad TP and the second thermal radiation part HS2 may have their planar shapes that are the same as each other and vertically overlap each other. When the wiring structure 600 is viewed in a plan view, the thermal conductive pad TP may have an "L" shape. The thermal conductive pad TP may have a second width W2 in the first direction X. The second width W2 may have a value, for example, from about 500 μm to about 7,000 μm. When the wiring structure 600 is viewed in a plan view, the thermal conductive layer TL may have a flat rectangular shape.

The thermal conductive layer TL and the second lower conductive patterns 32 may be the same in terms of thickness and material (e.g., metal such as copper). The thermal conductive pad TP and the second upper conductive patterns 34 may be the same in terms of thickness and material (e.g., metal such as copper). The thermal conductive via VT and the second circuit vias 30 may be the same in terms of thickness and material (e.g., metal such as copper). Alternatively, the thermal conductive layer TL, the thermal conductive pad TP, and the thermal conductive via VT may have different material and thickness (e.g., greater thickness) from those of the second lower conductive patterns 32, the second upper conductive patterns 34, and the second circuit vias 30, respectively. The thermal conductive layer TL, the thermal conductive pad TP, and the thermal conductive via VT may include or may be formed of a material (e.g., metal or graphene) whose thermal conductivity is greater than that of the second lower conductive patterns 32, the second upper conductive patterns 34, and the second circuit vias 30, respectively. In an embodiment, when the semiconductor package 1000 is viewed in a plan view, an area of the thermal conductive layer TL may be greater than or the same as that of the first semiconductor apparatus CH1. For example, a width, in the first direction X, of the thermal conductive layer TL may be greater than or the same as that of the first semiconductor apparatus CH1, and a width, in the second direction Y, of the thermal conductive layer TL may be greater than or the same as that of the first semiconductor apparatus CH1. As the overlapping area between the thermal conductive layer TL and the first semiconductor apparatus CH1 increases, heat generated from the first semiconductor apparatus CH1 may be transferred to the thermal radiation member HS more efficiently.

Figure 4A:
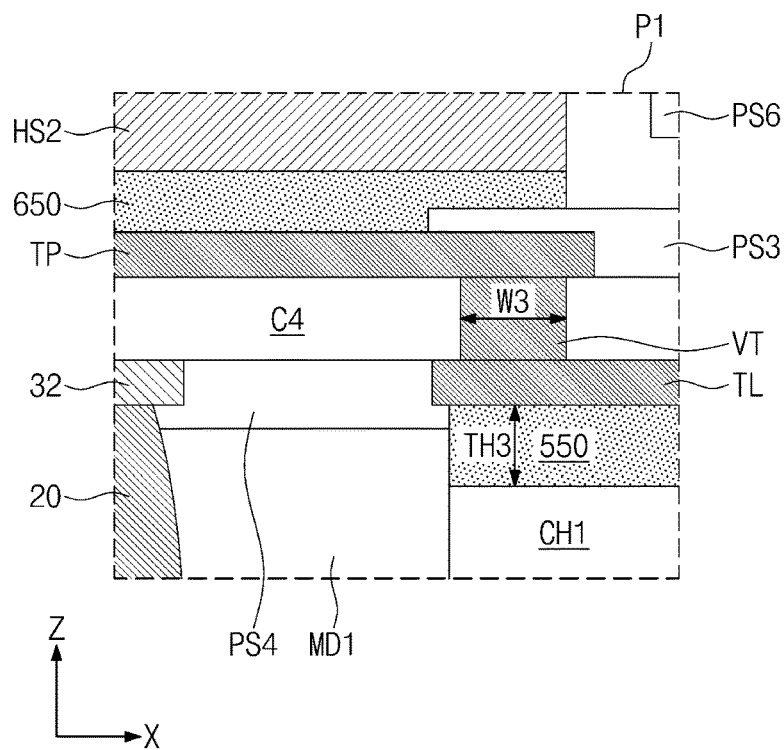
FIGS. 4A and 4B illustrate enlarged views showing section P1 of FIG. 2.
Figure 4B:
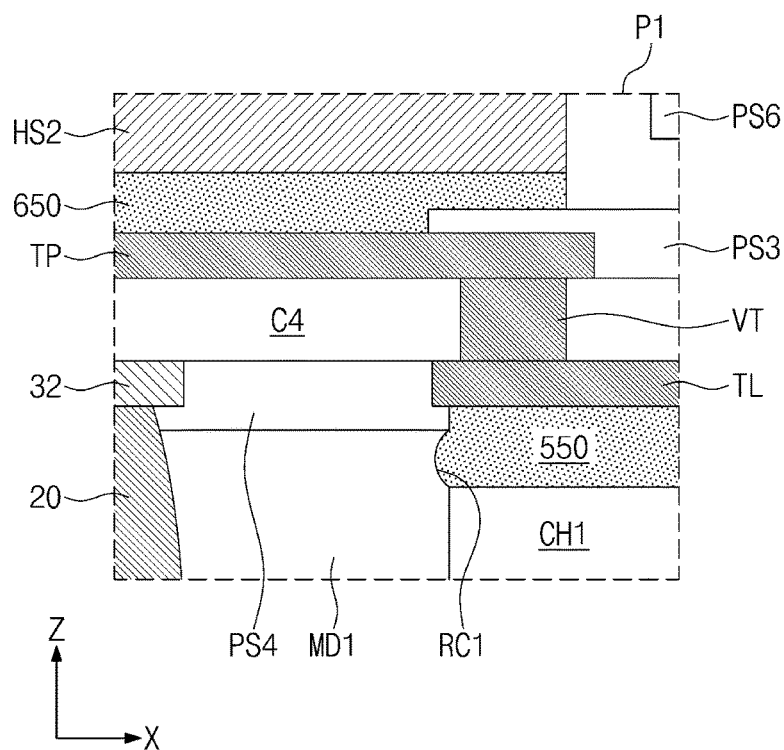
Figure 4C:
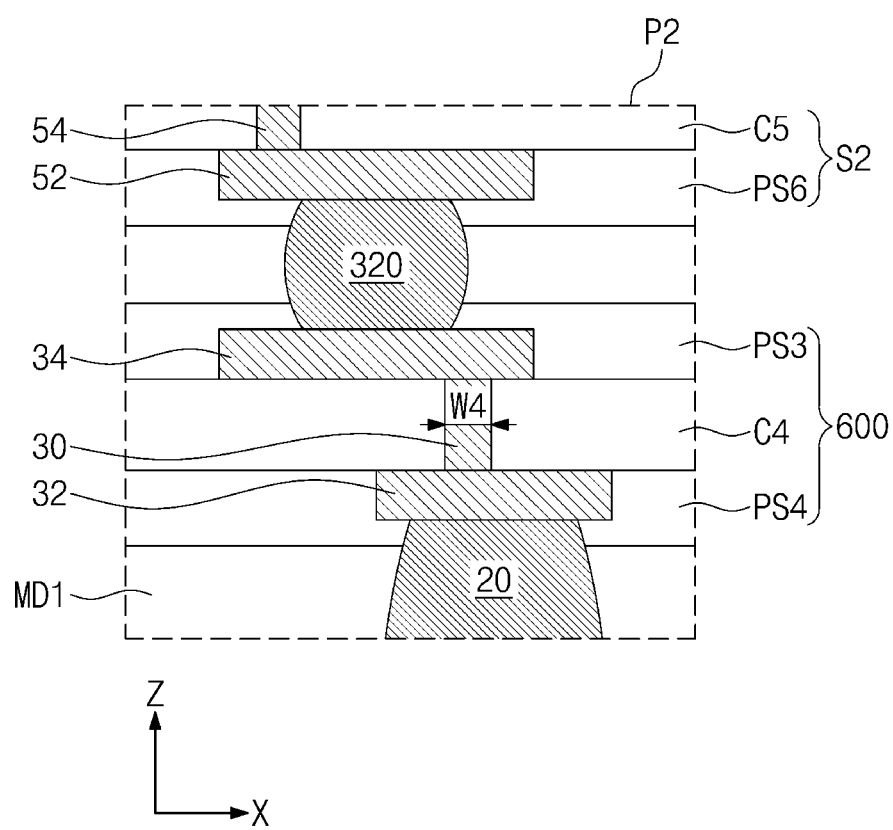
FIG. 4C illustrates an enlarged view showing section P2 of FIG. 2.

FIGS. 4A and 4B illustrate enlarged views showing section P1 of FIG. 2. FIG. 4C illustrates an enlarged view showing section P2 of FIG. 2.

Referring to FIGS. 4A and 4C, the thermal conductive via VT may have a third width W3 in the first direction X. The second circuit via 30 may have a fourth width W4 in the first direction X. The third width W3 may be greater than the fourth width W4. The third width W3 may have a value from about 100 μm to about 250 μm, for example, the fourth width W4 may have a value from about 1 μm to about 70 μm. The relatively large width of the thermal conductive via VT may facilitate thermal transfer from the thermal conductive layer TL to the thermal conductive pad TP. The present inventive concept is not limited thereto. For example, the third width W3 of the thermal conductive via VT may be the same as the fourth width W4 of the second circuit via 30. When heat transfer from the thermal conductive layer TL to the thermal conductive pad TP is secured, the thermal conductive via VT and the second circuit via 30 may have the same width as each other. Such heat transfer may also be secured by increasing the number of the thermal conductive via VT.

Referring to FIGS. 2, 4A, and 4B, a first thermal interface material layer 550 may be interposed between the wiring structure 600 and the first sub-semiconductor package 500. The first thermal interface material layer 550 has a thickness having a value from 5 μm to 40 μm. The first thermal interface material layer 550 may be in contact with a bottom surface of the thermal conductive layer TL and a top surface of the first semiconductor apparatus CH1. The first thermal interface material layer 550 may include or may be formed of a grease layer or a thermo-curable resin layer. The first thermal interface material layer 550 may further include filler particles dispersed in the thermo-curable resin layer. The filler particles may include or may be formed of a graphene power or a metal power whose thermal conductivity is high. Alternatively, the filler particles may include or may be formed of one or more of silica, alumina, zinc oxide, and boron nitride. The first thermal interface material layer 550 may have a bottom surface lower than a top surface of the first mold layer MD1. The first mold layer MD1 may cover a sidewall of the first thermal interface material layer 550. The first thermal interface material layer 550 may penetrate the second lower passivation layer PS4 and may contact the thermal conductive layer TL. As shown in FIG. 4A, the sidewall of the first thermal interface material layer 550 may be aligned with that of the first semiconductor apparatus CH1. Alternatively, a portion of the first thermal interface material layer 550 may protrude toward the first mold layer MD1. Therefore, the first mold layer MD1 may have a partially recessed region RC1 on an upper sidewall thereof. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Second internal connection members 20 may penetrate the first mold layer MD1 and may electrically connect the wiring structure 600 to the first substrate S1 of the first sub-semiconductor package 500. The second internal connection members 20 may connect the first upper conductive patterns 16 to the second lower conductive patterns 32. The second internal connection members 20 may be one or more of solder balls, conductive bumps, and conductive pillars.

Referring to FIG. 2, a second thermal interface material layer 650 may be interposed between the second thermal radiation part HS2 and the wiring structure 600. The second thermal interface material layer 650 may include or may be formed of a material which is the same as or similar to that of the first thermal interface material layer 550. The second thermal interface material layer 650 may penetrate the second upper passivation layer PS3 and may contact the thermal conductive pad TP.

Referring still to FIG. 2, the second sub-semiconductor package 700 may include a second substrate S2, a plurality of second semiconductor chips CH2 stacked on the second substrate S2, and a second mold layer MD2 that covers the second semiconductor chips CH2. The second substrate S2 may be a double-sided or multi-layered printed circuit board. The second substrate S2 may include a fifth body layer C5, third upper conductive patterns 54 disposed on a top surface of the fifth body layer C5, and third lower conductive patterns S2 disposed on a bottom surface of the fifth body layer C5. Third circuit vias 50 may penetrate the fifth body layer C5 and may electrically connect the third upper conductive patterns 54 to the third lower conductive patterns S2. The fifth body layer C5 may include or may be formed of a material which is the same as or similar to that of the first body layer C1. A third upper passivation layer PS5 may be disposed on the top surface of the fifth body layer C5 and may partially expose the third upper conductive patterns 54. A third lower passivation layer PS6 may be disposed on the bottom surface of the fifth body layer C5 and may partially expose the third lower conductive patterns S2. The third upper and lower passivation layers PS5 and PS6 may include or may be formed of a material which is the same as or similar to that of the first upper and lower passivation layers PS1 and PS2. The second semiconductor chips CH2 may be of the same kind of a memory chip. The second semiconductor chips CH2 may be offset from each other in the first direction X or in the first and second directions X and Y and may be stacked to constitute a stepwise structure. The second semiconductor chips CH2 may be connected through wires 60 to the third upper conductive patterns 54.

The second sub-semiconductor package 700 may be electrically connected through third internal connection members 320 to the wiring structure 600. The third internal connection members 320 may connect the third lower conductive patterns S2 to the second upper conductive patterns 34. The third internal connection members 320 may be one or more of solder balls, conductive bumps, and conductive pillars.

A third thermal interface material layer 750 may be interposed between the second sub-semiconductor package 700 and the first thermal radiation part HS1. The third thermal interface material layer 750 may include or may be formed of a material which is the same as or similar to that of the first thermal interface material layer 550. The third thermal interface material layer 750 may contact a top surface of the second mold layer MD2.

The semiconductor package 1000 according to some example embodiments of the present inventive concepts may be configured such that the wiring structure 600 includes the thermal conductive layer TL, the thermal conductive via VT, and the thermal conductive pad TP, which are arranged to transfer heat from the first semiconductor apparatus CH1 to the thermal radiation member HS. Therefore, heat generated from the first semiconductor apparatus CH1 may be immediately discharged outwards. Accordingly, it may be possible to minimize, reduce, or prevent an increase in temperature of the first semiconductor apparatus CH1. A reduction in speed of the first semiconductor apparatus CH1 may be prevented to avoid operating failure of the semiconductor package 1000, which may result in an improvement in overall performance of the semiconductor package 1000. The first, second, and third circuit vias 10, 30, and 50 may transmit electrical signals. Although not shown, the third width W3 of the thermal conductive via VT may be greater than a width of the first circuit via 10. The third width W3 of the thermal conductive via VT may be greater than a width of the third circuit via 50. The width of the thermal conductive via VT may be relatively greater than those of the first, second, and third circuit vias 10, 30, and 50 to facilitate heat transfer from the first semiconductor apparatus CH1 to the thermal radiation member HS.

FIGS. 5A to 5E illustrate cross-sectional views showing a method of fabricating a semiconductor package of FIG. 2.

Figure 5A:
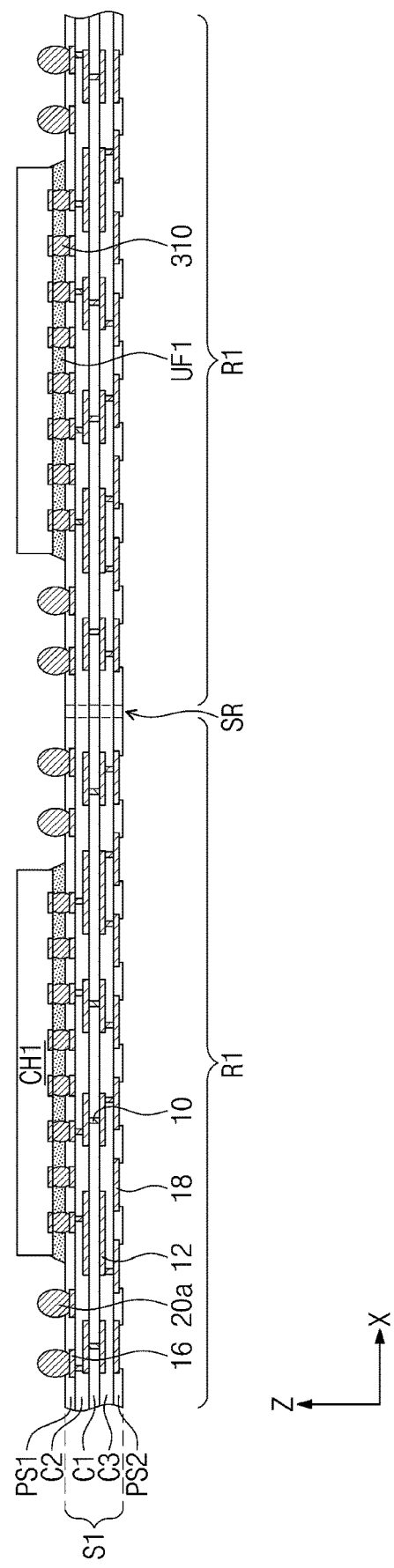

Referring to FIG. 5A, a first substrate S1 may be prepared. The first substrate S1 may include chip regions R1 and a separation region SR between the chip regions R1. The first substrate S1 may have on each of the chip regions R1 a structure which is the same as or similar to that discussed with reference to FIG. 2. First internal connection members 310 may be used to flip-chip bond first semiconductor apparatuses CH1 to corresponding chip regions R1 of the first substrate S1. A first under-fill layer UF1 may be interposed between each of the first semiconductor apparatuses CH1 and the first substrate S1. First preliminary connection members 20a may be bonded to first upper conductive patterns 16 of the first substrate S1 beside the first semiconductor apparatuses CH1. The first preliminary connection members 20a may be solder balls, conductive bumps, or conductive pillars.

Figure 5B:
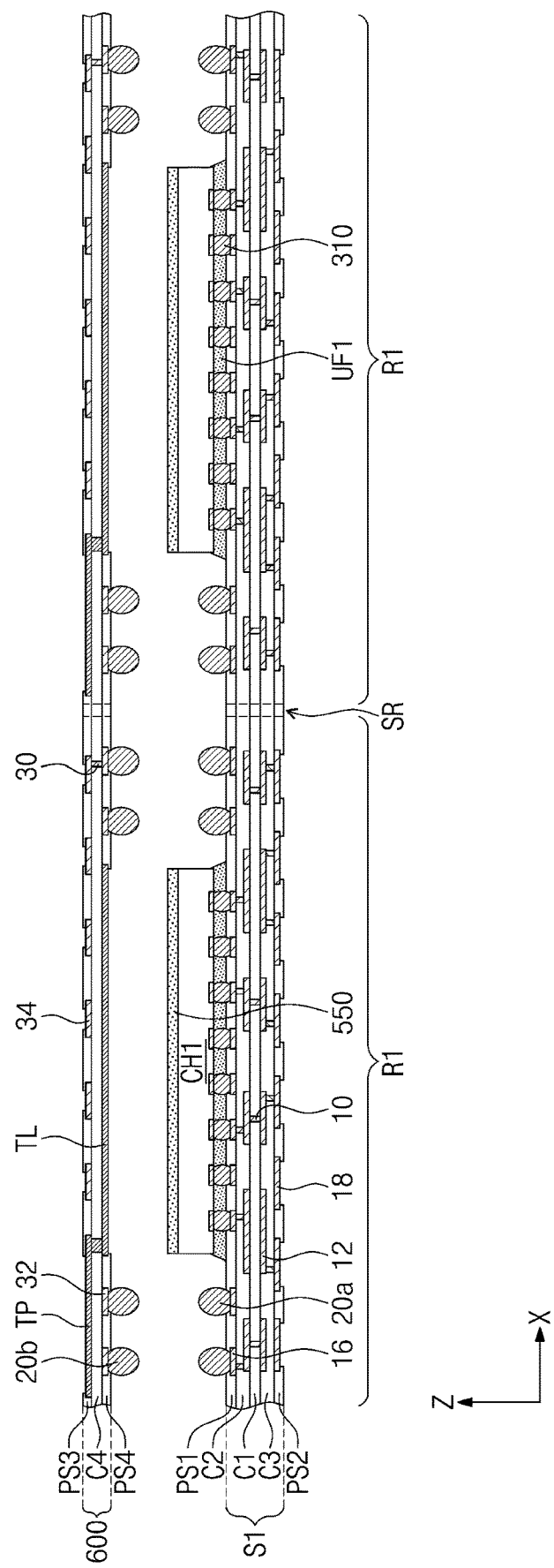

Referring to FIG. 5B, a first thermal interface material layer 550 may be formed on the first semiconductor apparatus CH1. A wiring structure 600 may be positioned on the first substrate S1. The wiring structure 600 may have structures which are the same as or similar to those discussed with reference to FIGS. 3A and 3B. The wiring structure 600 may be aligned to the chip regions R1. Second preliminary connection members 20b may be bonded to second lower conductive patterns 32 of the wiring structure 600. The second preliminary connection members 20b may be, for example, solder balls, conductive bumps, or conductive pillars.

Figure 5C:
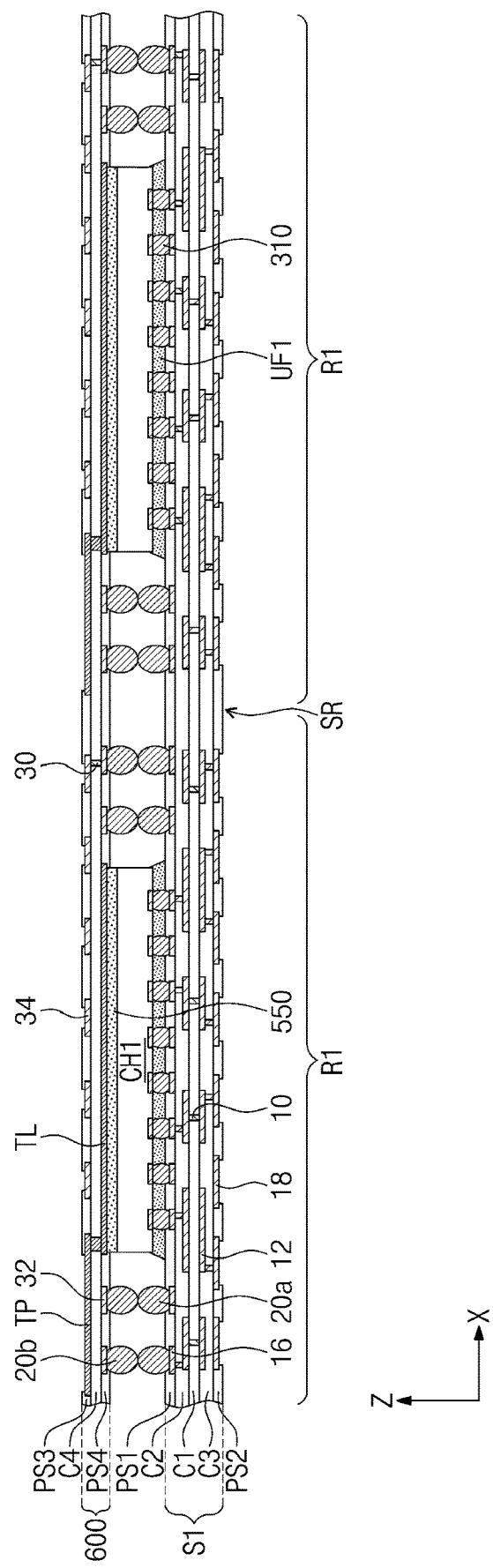
Figure 5D:
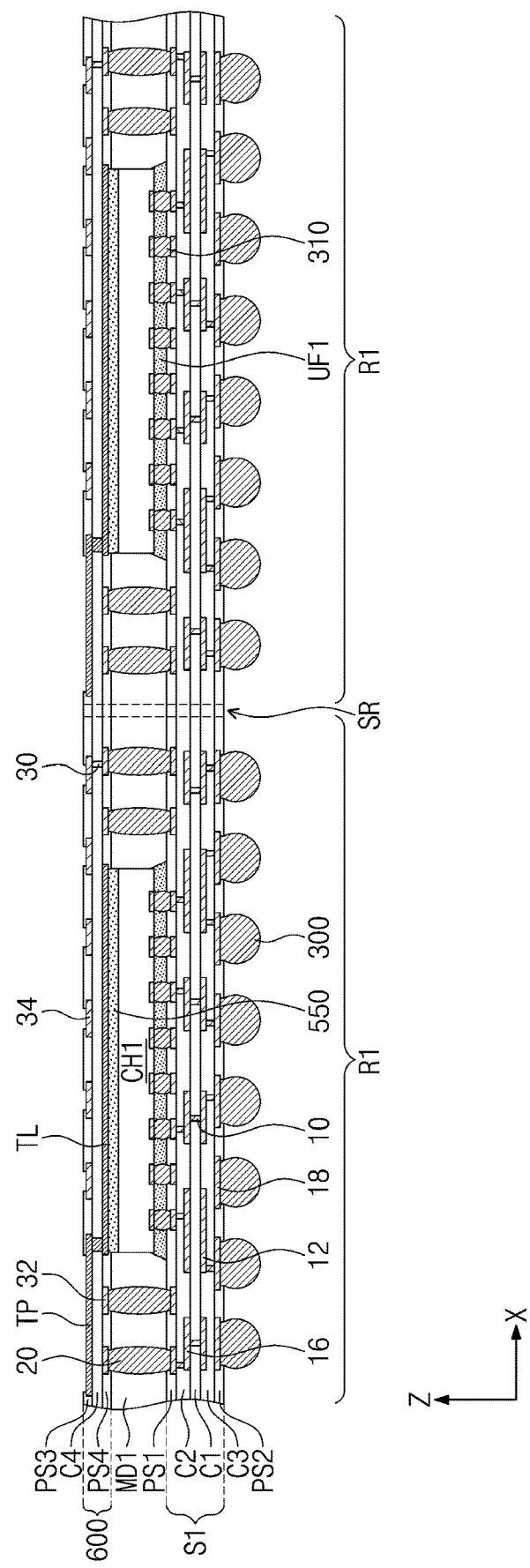

Referring to FIGS. 5C and 5D, a reflow process may be performed after a thermal conductive layer TL of the wiring structure 600 is allowed to contact the first thermal interface material layer 550 and the second preliminary connection member 20b is allowed to contact the first preliminary connection member 20a. In the reflow process, the first preliminary connection member 20a and the second preliminary connection member 20b may be melted and connected to each other to form a second internal connection member 20. A molding process may be performed to form a first mold layer MD1 that fills a space between the wiring structure 600 and the first substrate S1. External connection terminals 300 may be bonded to first lower conductive patterns 18 of the first substrate S1.

Referring to FIGS. 5D and 5E, a sawing or singulation process may be performed to separate the wiring structure 600, the first mold layer MD1, and the first substrate S1 from the separation region SR into individual preliminary semiconductor packages PPKG. In each preliminary semiconductor package PPKG, the wiring structure 600 is stacked on a first sub-semiconductor package 500. The preliminary semiconductor packages PPKG may be tested to select non-defective preliminary semiconductor packages PPKG.

Referring back to FIGS. 2 and 5E, second sub-semiconductor packages 700 may be prepared. The second sub-semiconductor packages 700 may also be tested to select non-defective second sub-semiconductor packages 700. The second sub-semiconductor package 700 may be flip-chip bonded to the preliminary semiconductor package PPKG. In this step, the second sub-semiconductor package 700 may be disposed to expose thermal conductive pads TP. For example, in the preliminary semiconductor package PPKG with the second sub-semiconductor package 700 flip-chip bonded thereto, the second sub-semiconductor package 700 does not cover the thermal conductive pads TP. A second thermal interface material layer 650 and a third thermal interface material layer 750 may be formed on the preliminary semiconductor package PPKG with the second sub-semiconductor package 700 flip-chip bonded thereto. For example, the second thermal interface material layer 650 may be formed on the thermal conductive pad TP, and the third thermal interface material layer 750 may be formed on the second sub-semiconductor package 700. A thermal radiation member HS may be bonded to the second sub-semiconductor package 700 with the third thermal interface material layer 750. A semiconductor package 1000 may thus be fabricated as shown in FIG. 2.

Figure 6:
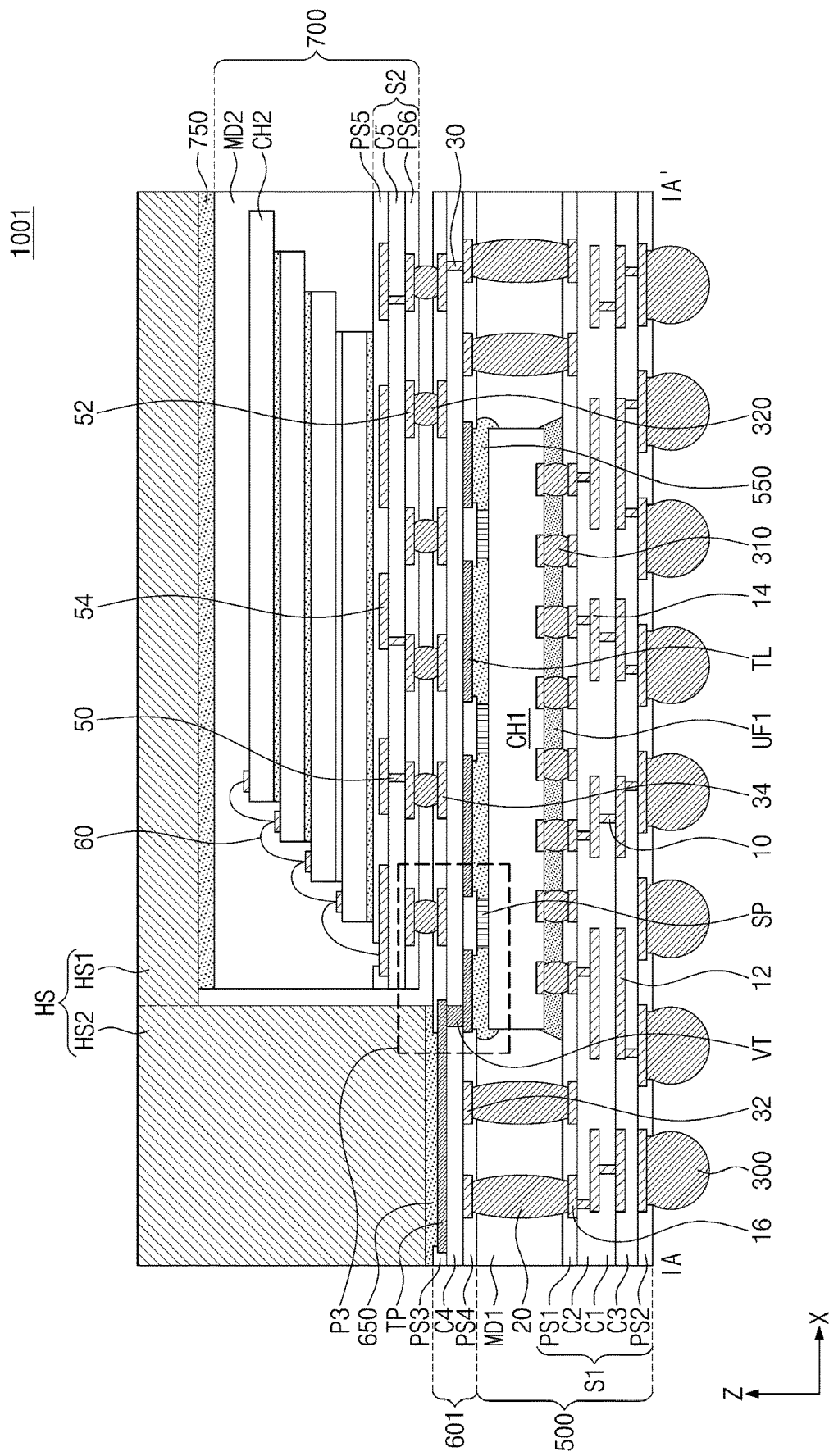
FIG. 6 illustrates a cross-sectional view taken along line IA-IA' of FIG. 1.
Figure 7A:
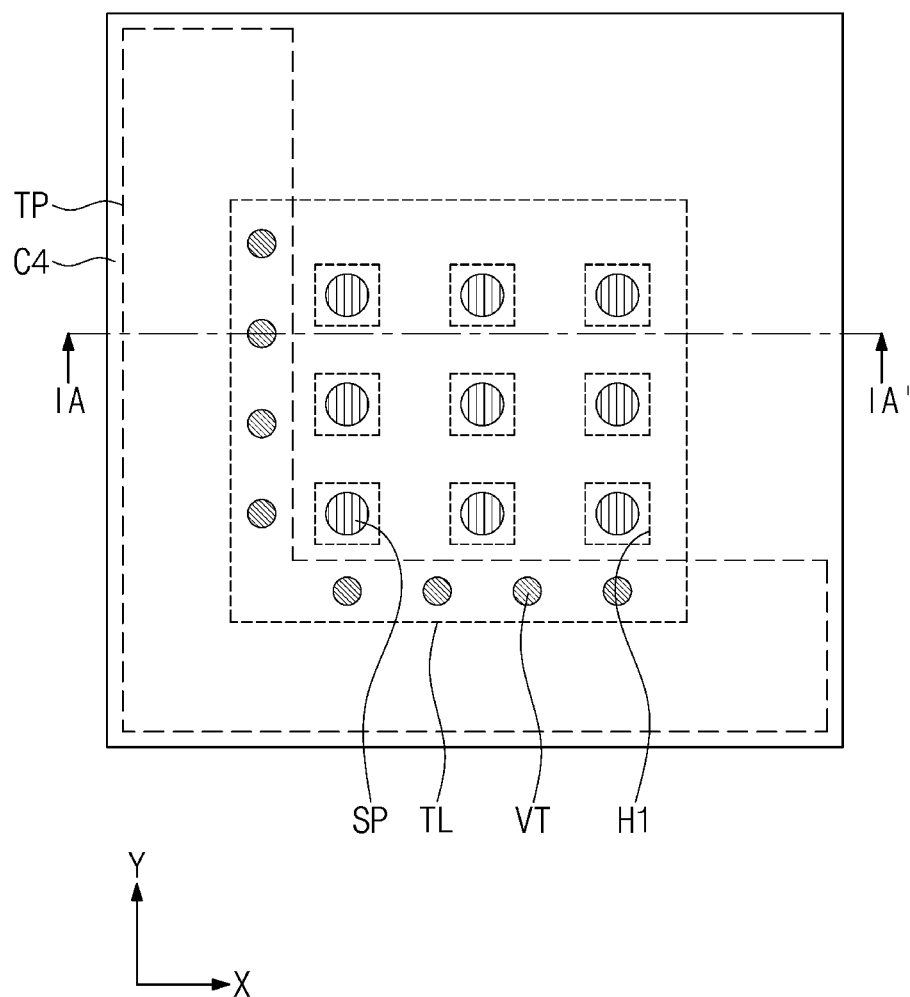
FIG. 7A illustrates a plan view showing a wiring structure according to some example embodiments of the present inventive concepts.
Figure 7B:
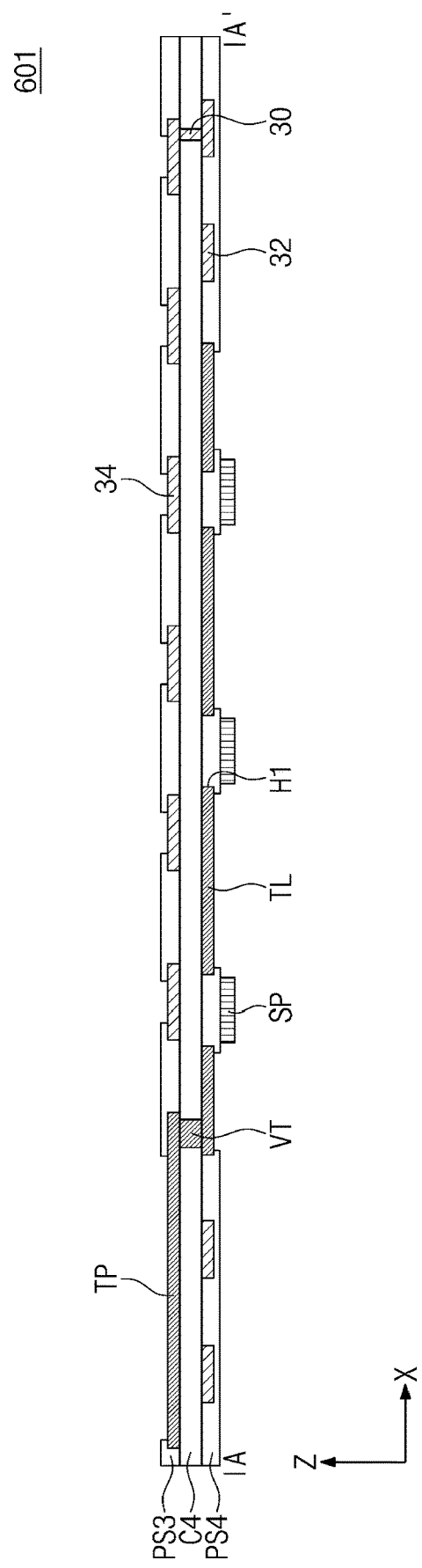
FIG. 7B illustrates a cross-sectional view taken along line IA-IA' of FIG. 7A.

FIG. 6 illustrates a cross-sectional view taken along line IA-IA' of FIG. 1. FIG. 7A illustrates a plan view showing a wiring structure according to some example embodiments of the present inventive concepts. FIG. 7B illustrates a cross-sectional view taken along line IA-IA' of FIG. 7A.

Referring to FIGS. 6, 7A, and 7B, a semiconductor package 1001 according to the present embodiment may include a first sub-semiconductor package 500, a wiring structure 601, a second sub-semiconductor package 700, and a thermal radiation member HS that are sequentially stacked on each other. The first sub-semiconductor package 500, the second sub-semiconductor package 700, and the thermal radiation member HS may be the same as or similar to those discussed with reference to FIG. 2. The wiring structure 601 may have a different structure from that of the wiring structure 600 shown in FIGS. 3A and 3B.

The wiring structure 601 may further include a dielectric support pattern SP bonded to a bottom surface of the second lower passivation layer PS4. The dielectric support pattern SP may include or may be formed of one or more of an epoxy resin, a die attach film (DAF), a non-conductive film (NCF), and a photosensitive solder resist (PSR) layer. The dielectric support pattern SP may be formed to have a plurality of island shapes that are spaced apart from each other in the first and second directions X and Y. The dielectric support pattern SP may maintain a certain distance between the wiring structure 601 and the first semiconductor apparatus CH1 in the fabrication step of FIG. 5C. The dielectric support pattern SP may support the wiring structure 601 and may prevent warpage of the wiring structure 601. The semiconductor package 1001 with the dielectric support pattern SP may increase reliability.

The thermal conductive layer TL of the wiring structure 601 may have a grid shape. When the wiring structure 601 is viewed in a plan view, the thermal conductive layer TL may have a plurality of openings H1 that are shaped like islands spaced apart from each other. The openings H1 may be filled with the second lower passivation layer PS4. The dielectric support patterns SP may overlap portions of the second lower passivation layer PS4 filling the openings H1. The other configurations may be identical or similar to those discussed with reference to FIGS. 3A and 3B.

Figure 8A:
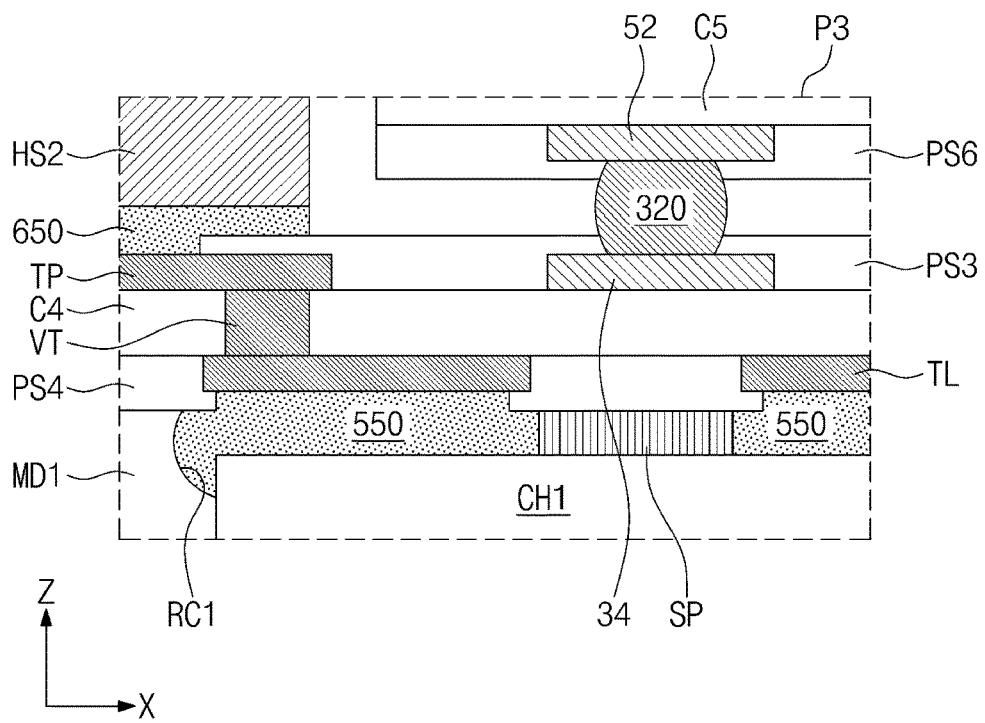
FIGS. 8A and 8B illustrate enlarged views showing section P3 of FIG. 6.
Figure 8B:
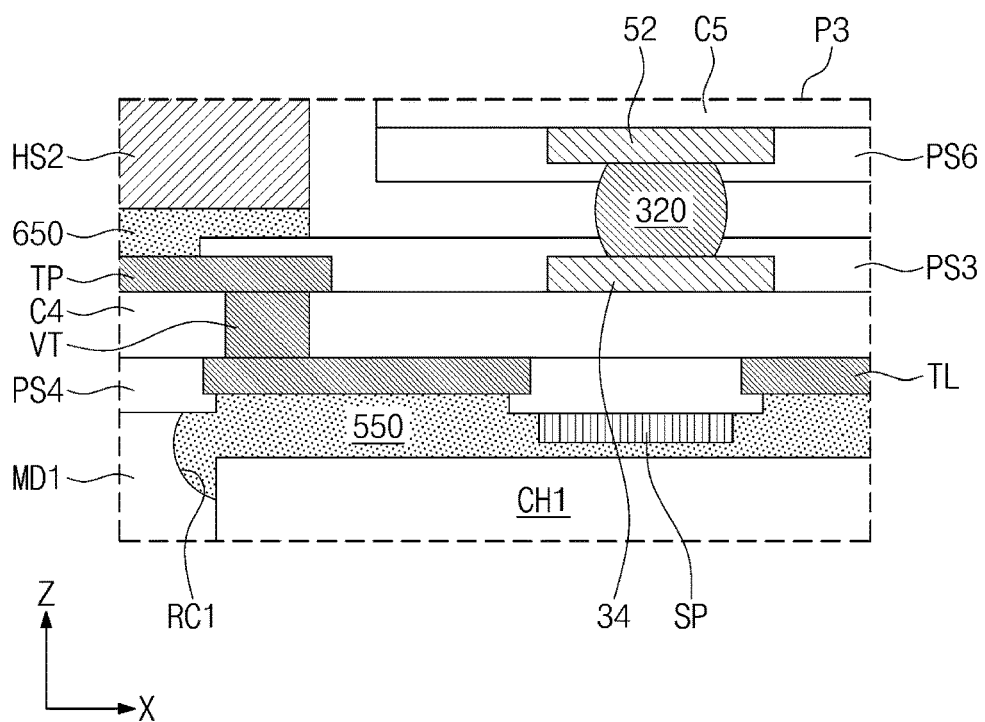

FIGS. 8A and 8B illustrate enlarged views showing section P3 of FIG. 6.

Referring to FIG. 8A, the dielectric support pattern SP may contact the top surface of the first semiconductor apparatus CH1. The first thermal interface material layer 550 adjacent to an edge of the first semiconductor apparatus CH1 may laterally protrude beyond the first semiconductor apparatus CH1 to thereby contact an upper sidewall of the first semiconductor apparatus CH1. The first thermal interface material layer 550 may contact the bottom surface of the second lower passivation layer PS4. The first mold layer MD1 may have, on its upper sidewall, a recessed region RC1 in contact with the first thermal interface material layer 550.

Alternatively, as shown in FIG. 8B, the dielectric support pattern SP may be spaced apart from the top surface of the first semiconductor apparatus CH1. A portion of the first thermal interface material layer 550 may be interposed between the dielectric support pattern SP and the first semiconductor apparatus CH1. The other structural features may be identical or similar to those discussed with reference to FIG. 8A.

Figure 9:
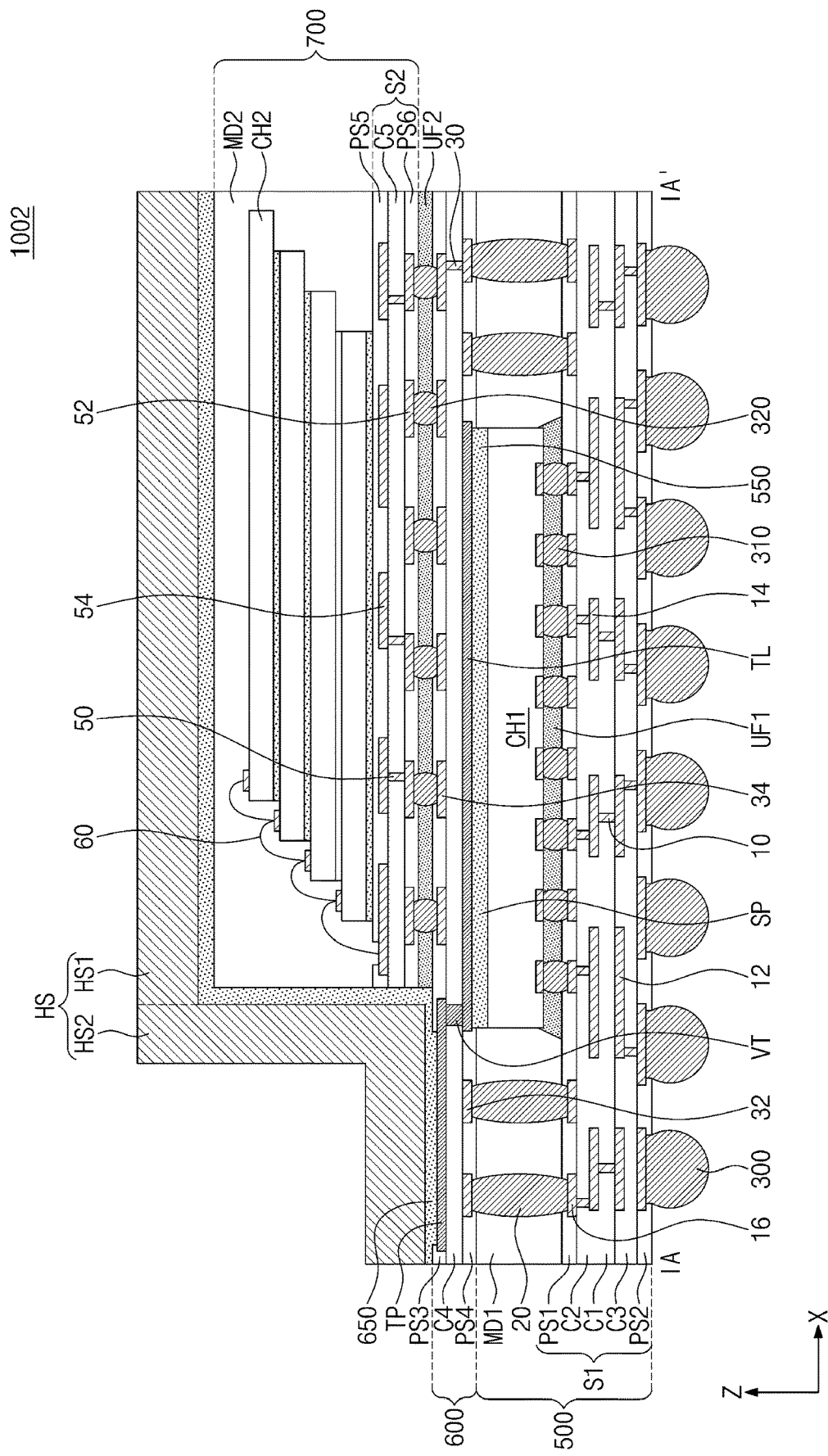
FIG. 9 illustrates a cross-sectional view taken along line IA-IA' of FIG. 1.

FIG. 9 illustrates a cross-sectional view taken along line IA-IA' of FIG. 1.

Referring to FIG. 9, a semiconductor package 1002 according to the present embodiment may include a first sub-semiconductor package 500, a wiring structure 600, a second sub-semiconductor package 700, and a thermal radiation member HS that are sequentially stacked on each other. The first sub-semiconductor package 500, the wiring structure 600, and the second sub-semiconductor package 700 may be the same as or similar to those discussed with reference to FIG. 2. The thermal radiation member HS may have a structure different from that of FIG. 2. In the present embodiment, the thermal radiation member HS may have a uniform thickness as a whole. The second thermal radiation part HS2 of the thermal radiation member HS may have an L-shaped cross-section. The second thermal interface material layer 650 may extend from a gap between the second thermal radiation part HS2 and the wiring structure 600 into a gap between the second thermal radiation part HS2 and a sidewall of the second sub-semiconductor package 700. The second thermal interface material layer 650 may further extend into a gap between the first thermal radiation part HS1 and a top surface of the second sub-semiconductor package 700. The second under-fill layer UF2 may fill a space between the second sub-semiconductor package 700 and the wiring structure 600. The second under-fill layer UF2 may include or may be formed of a material which is the same as or similar to that of the first under-fill layer UF1. The other configurations may be identical or similar to those discussed with reference to FIGS. 1 to 4C.

Figure 10:
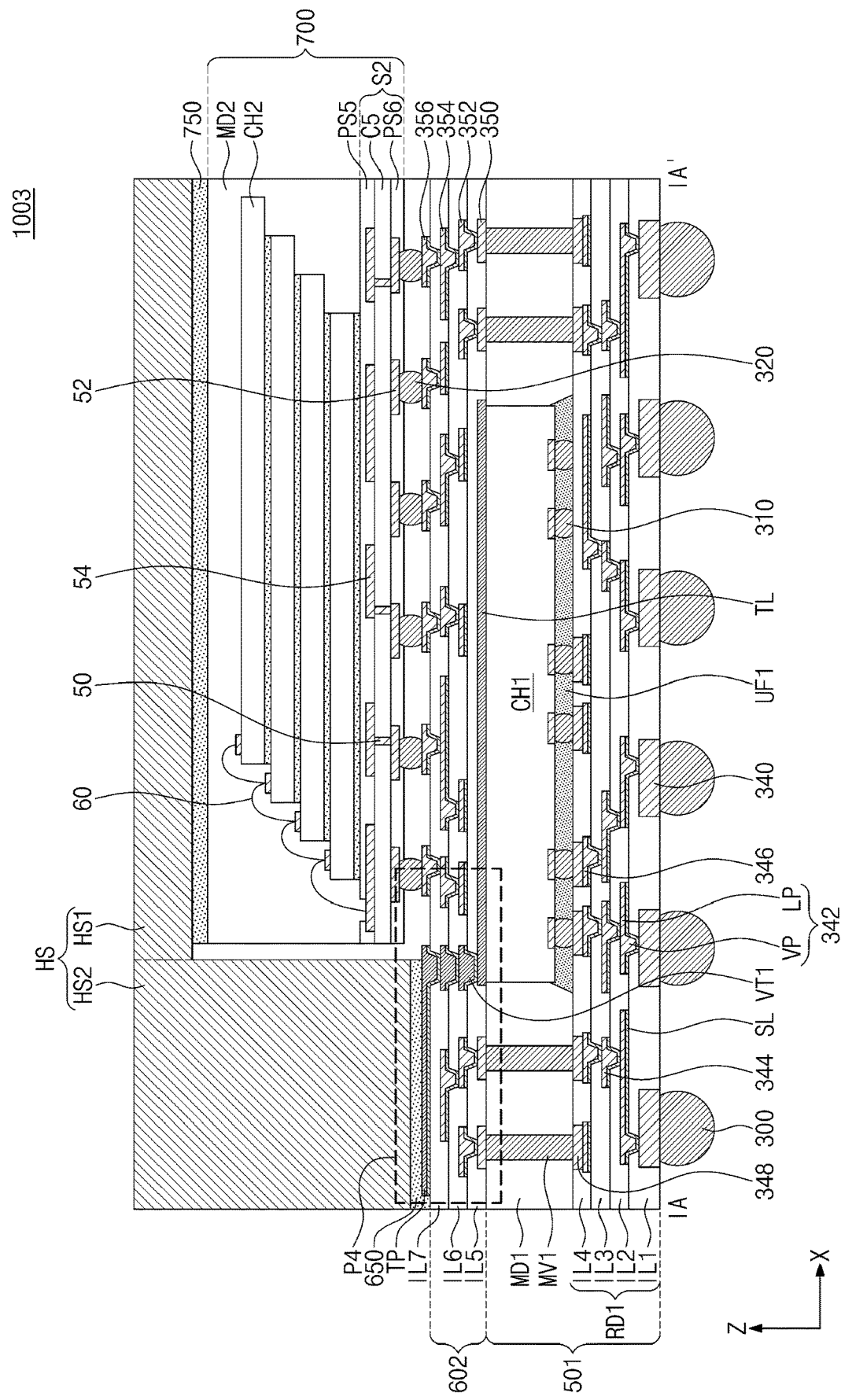
FIG. 10 illustrates a cross-sectional view taken along line IA-IA' of FIG. 1.

FIG. 10 illustrates a cross-sectional view taken along line IA-IA' of FIG. 1.

Referring to FIG. 10, a semiconductor package 1003 according to the present embodiment may include a first sub-semiconductor package 501, a wiring structure 602, a second sub-semiconductor package 700, and a thermal radiation member HS that are sequentially stacked on each other. The first sub-semiconductor package 501 may be shaped like a chip last-type fan-out wafer level package (FOWLP). The first sub-semiconductor package 501 may include a first redistribution substrate RD1, a first semiconductor apparatus CH1 mounted on the first redistribution substrate RD1, and a first mold layer MD1 that covers the first semiconductor apparatus CH1. The first semiconductor apparatus CH1 may be flip-chip bonded through the first internal connection members 310 to the first redistribution substrate RD1.

The first redistribution substrate RD1 may include first, second, third, and fourth redistribution dielectric layers IL1, IL2, IL3, and IL4 that are sequentially stacked on each other. The first, second, third, and fourth redistribution dielectric layers IL1, IL2, IL3, and IL4 may be photo-imagable dielectric (PID) layer. First, second, and third redistribution patterns 342, 344, and 346 may be disposed between the first, second, third, and fourth redistribution dielectric layers IL1, IL2, IL3, and IL4. The first, second, and third redistribution patterns 342, 344, and 346 may include or may be formed of a conductive material, such as metal. Each of the first, second, and third redistribution patterns 342, 344, and 346 may include a via part VP and a line part LP that are integrally united with each other. The via part VP may be disposed below the line part LP. A barrier/seed pattern SL may be interposed between the first redistribution pattern 342 and the first redistribution dielectric layer IL1, between the second redistribution pattern 344 and the second redistribution dielectric layer IL2, and between the third redistribution pattern 346 and the third redistribution dielectric layer IL3. The barrier/seed pattern SL may include a barrier layer and a seed layer that are sequentially stacked on each other. The barrier layer may include or may be formed of a metal nitride layer. The seed layer may include or may be formed of the same metal as that of the first, second, and third redistribution patterns 342, 344, and 346.

A first redistribution bump 340 may be provided in the first redistribution dielectric layer IL1. A first redistribution pad 348 may be disposed in the fourth redistribution dielectric layer IL4. The external connection terminal 300 may be bonded to the first redistribution bump 340. The first mold layer MD1 may cover the sidewall of the first semiconductor apparatus CH1 and a top surface of the first redistribution substrate RD1. A first mold via MV1 may penetrate the first mold layer MD1 and may contact the first redistribution pad 348 of the first redistribution substrate RD1. The first mold via MV1 may include or may be formed of metal, such as copper. The first mold via MV1 may electrically connect the wiring structure 602 to the first redistribution substrate RD1.

Figure 11:
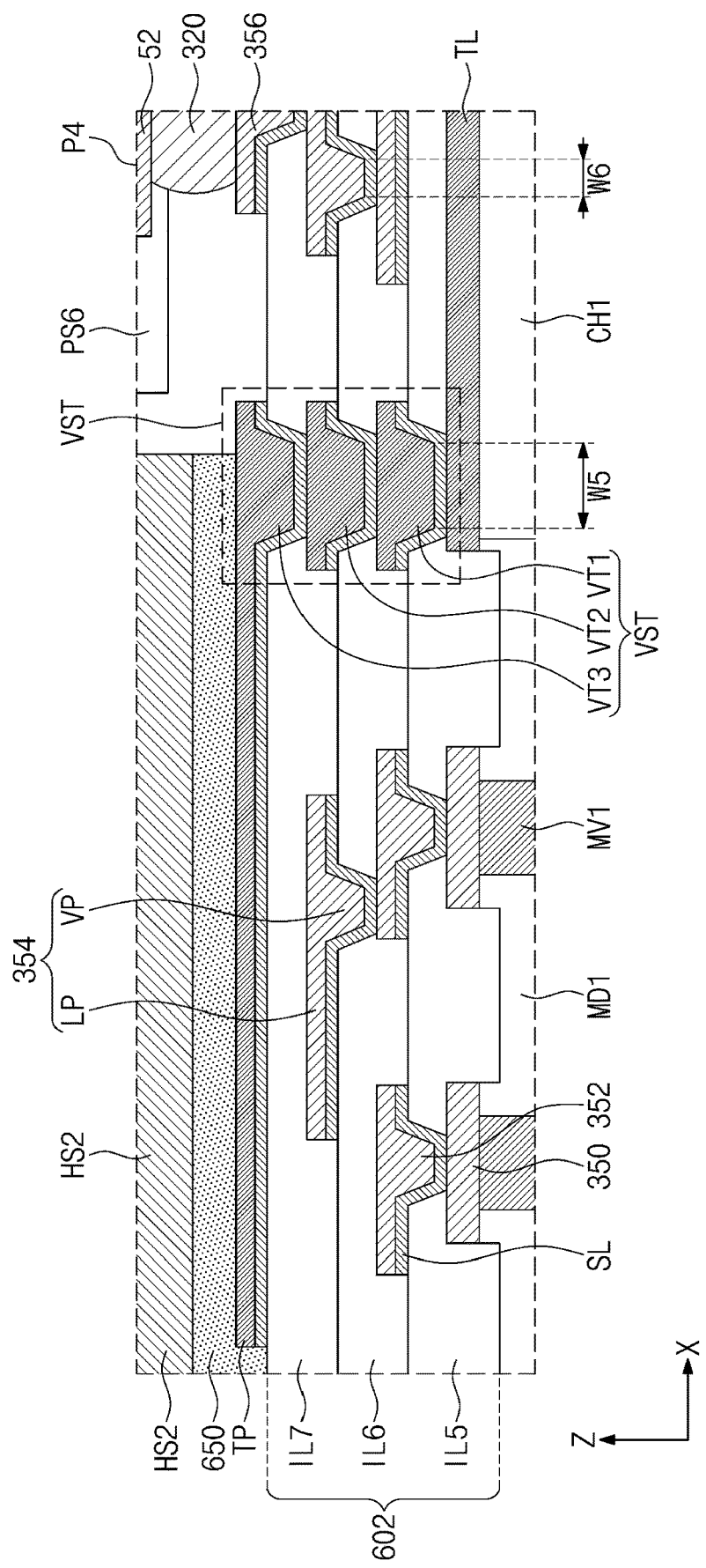
FIG. 11 illustrates an enlarged view showing section P4 of FIG. 10.

FIG. 11 an enlarged view showing section P4 of FIG. 10.

Referring to FIGS. 10 and 11, the wiring structure 602 may have a structure similar to that of the first redistribution substrate RD1. In the present embodiment, the wiring structure 602 may be called a second redistribution substrate. The wiring structure 602 may include fifth, sixth, and seventh redistribution dielectric layers IL5, IL6, and IL7, and may also include fourth and fifth redistribution patterns 352 and 354 interposed between the fifth, sixth, and seventh redistribution dielectric layers IL5, IL6, and IL7. A sixth redistribution pattern 356 may be disposed on the seventh redistribution dielectric layer IL7. Like the first, second, and third redistribution patterns 342, 344, and 346, each of the fourth, fifth, sixth redistribution patterns 352, 354, and 356 may also include a via part VP and a line part LP. The via parts VP of the first, second, third, fourth, fifth, and sixth redistribution patterns 342, 344, 346, 352, 354, and 356 may have their inclined sidewalls.

A barrier/seed pattern SL may be interposed between the fourth redistribution pattern 352 and the fifth redistribution dielectric layer IL5, between the fifth redistribution pattern 354 and the sixth redistribution dielectric layer IL6, and between the sixth redistribution pattern 356 and the seventh redistribution dielectric layer IL7. A second redistribution bump 350 may be disposed in the fifth redistribution dielectric layer IL5.

The first mold via MV1 may connect the second redistribution bump 350 to the first redistribution pad 348. The wiring structure 602 may include a thermal conductive layer TL, a thermal conductive pad TP, and a thermal conductive via structure VST that connects the thermal conductive layer TL to the thermal conductive pad TP. The thermal conductive via structure VST may include first, second, and third thermal conductive via parts VT1, VT2, and VT3 that are stacked on each other. The term "thermal conductive via part" may be called "sub-via."

The first, second, and third thermal conductive via parts VT1, VT2, and VT3 may have their inclined sidewalls. The thermal conductive via structure VST may further include a barrier/seed pattern SL interposed between the first thermal conductive via part VT1 and the fifth redistribution dielectric layer IL5, between the second thermal conductive via part VT2 and the sixth redistribution dielectric layer IL6, and between the third thermal conductive via part VT3 and the seventh redistribution dielectric layer IL7. The barrier/seed pattern SL may also be interposed between the thermal conductive pad TP and the seventh redistribution dielectric layer IL7.

The first, second, and third thermal conductive via parts VT1, VT2, and VT3 may each have a fifth width W5 greater than a sixth width W6 of each of the via parts VP of the fourth, fifth, and sixth redistribution patterns 352, 354, and 356. In an embodiment, the fifth width W5 may be the minimum width of each of the first, second, and third thermal conductive via parts VT1, VT2, and VT3, and the sixth width W6 may be the minimum width of each of the via parts VP. The first thermal conductive via part VT1 may have an increasing width from the fifth width W5 in a third direction Z. In an embodiment, the width of the first thermal conductive via part VT1 may gradually increase from the fifth width W5 in a third direction Z. This width increase of the first thermal conductive via part VT1 may be applicable to the remaining thermal conductive via parts VT2 and VT3. The width of each via part VP may increase from the sixth width W6 in the third direction Z. The fifth width W5 may have a value, for example, from about 100 μm to about 250 μm. The sixth width W6 may have a value, for example, from about 1 μm to about 70 μm.

The thermal conductive layer TL may have the same material and thickness as those of the second redistribution bump 350. The thermal conductive pad TP may be connected to the third thermal conductive via part VT3, and may have the same thickness and material as those of the line part LP of the sixth redistribution pattern 356. The first, second, and third thermal conductive via parts VT1, VT2, and VT3 may have the same thickness and material as those of the via parts VP of the fourth, fifth, and sixth redistribution patterns 352, 354, and 356. Alternatively, the thermal conductive layer TL, the thermal conductive pad TP, and the first, second, and third thermal conductive via parts VT1, VT2, and VT3 may have different material (e.g., a material whose thermal conductivity is higher) and thickness (e.g., greater thickness) from those of the fourth, fifth, and sixth redistribution patterns 352, 354, and 356.

In the embodiment shown in FIGS. 10 and 11, the semiconductor package 1003 may be implemented without including the first thermal interface material layer 550 of FIG. 2. In the present embodiment, the second thermal interface material layer 650 may cover a top surface and a sidewall of the thermal conductive pad TP and a sidewall of the barrier/seed pattern SL below the thermal conductive pad TP. The fifth redistribution dielectric layer IL5 may have a bottom surface lower than that of the second redistribution bump 350 and that of the thermal conductive layer TL. The first mold layer MD1 may surround a sidewall of the first mold via MV1 and a sidewall of the first semiconductor apparatus CH1. In an embodiment, an upper surface of the first mold layer MD1 may be uneven, and the first mold layer MD1 may be interposed between an upper portion of the first mold via MV1 and a lower portion of the fifth redistribution dielectric layer IL5 which are adjacent to each other in the first direction X, and between an upper portion of the first semiconductor apparatus CH1 and a lower portion of the first redistribution dielectric layer IL5 which are adjacent to each other in the first direction X. The topmost upper surface of the first mold layer MD1 may contact a bottom surface of the second redistribution bumps 350, and a bottom surface of the thermal conductive layer TL. The other configurations may be identical or similar to those discussed with reference to FIGS. 1 to 4C.

Figure 12:
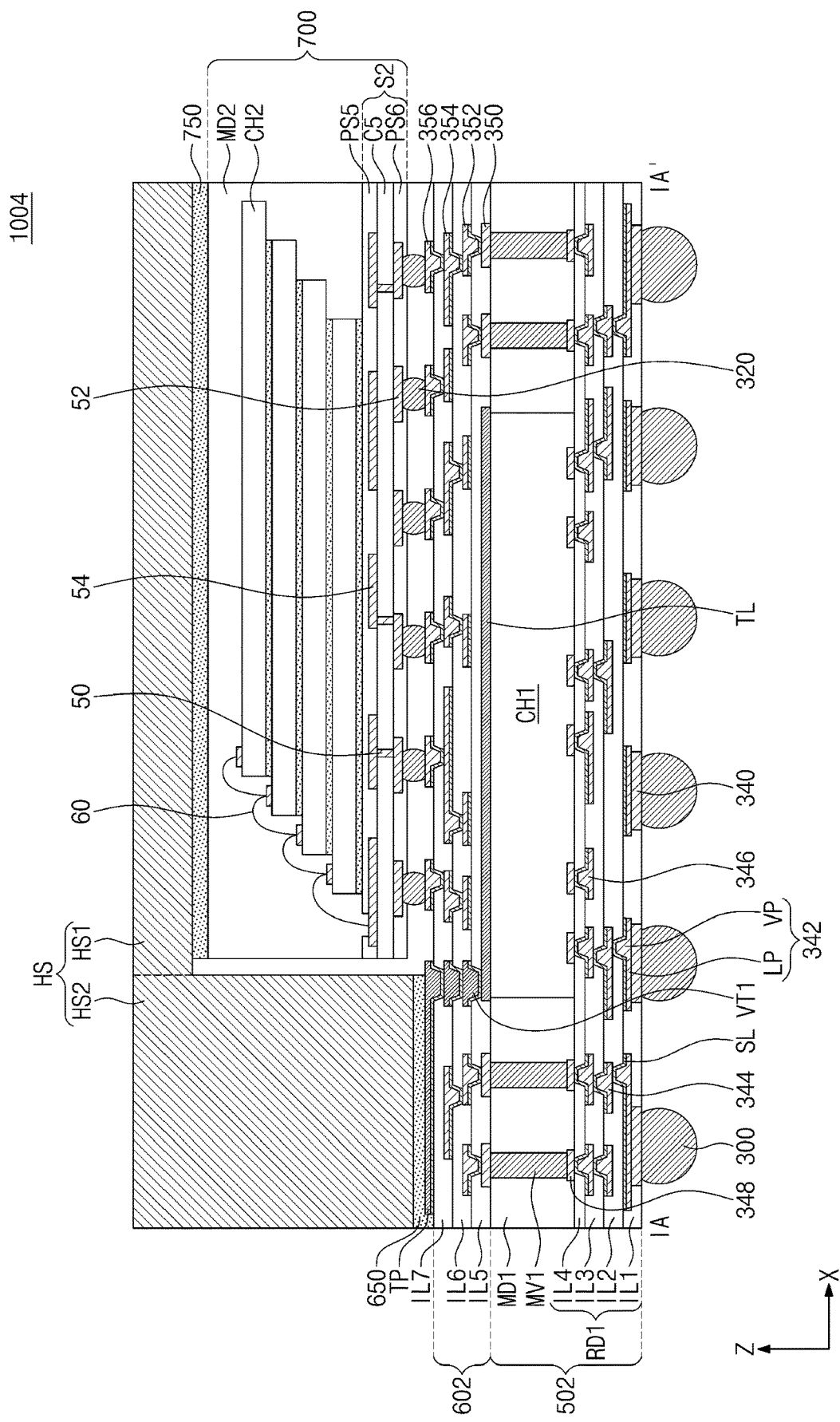
FIG. 12 illustrates a cross-sectional view taken along line IA-IA' of FIG. 1.

FIG. 12 illustrates a cross-sectional view taken along line IA-IA' of FIG. 1.

Referring to FIG. 12, a semiconductor package 1004 according to the present embodiment may include a first sub-semiconductor package 502, a wiring structure 602, a second sub-semiconductor package 700, and a thermal radiation member HS that are sequentially stacked on each other. The first sub-semiconductor package 502 may be shaped like a chip first-type fan-out wafer level package (FOWLP). The first sub-semiconductor package 502 may include a first redistribution substrate RD1, a first semiconductor apparatus CH1 mounted on the first redistribution substrate RD1, and a first mold layer MD1 that covers the first semiconductor apparatus CH1. The first semiconductor apparatus CH1 may contact the first redistribution substrate RD1. The first under-fill layer UF1 and the first internal connection member 310 of FIG. 10 are not present in the first sub-semiconductor package 502.

Each of first, second, and third redistribution patterns 342, 344, and 346 included in the first redistribution substrate RD1 may include a via part VP and a line part LP that are integrally united with each other. The via part VP may be positioned on the line part LP. A barrier/seed pattern SL may be interposed between the first redistribution pattern 342 and a second redistribution dielectric layer IL2, between the second redistribution pattern 344 and a third redistribution dielectric layer IL3, and between the third redistribution pattern 346 and a fourth redistribution dielectric layer IL4. The first redistribution dielectric layer IL1 may have therein a first redistribution bump 340 in contact with the line part LP of the first redistribution pattern 342. A first redistribution pad 348 may be positioned on the fourth redistribution dielectric layer IL4. The other configurations may be identical or similar to those discussed with reference to FIGS. 10 and 11.

Figure 13:
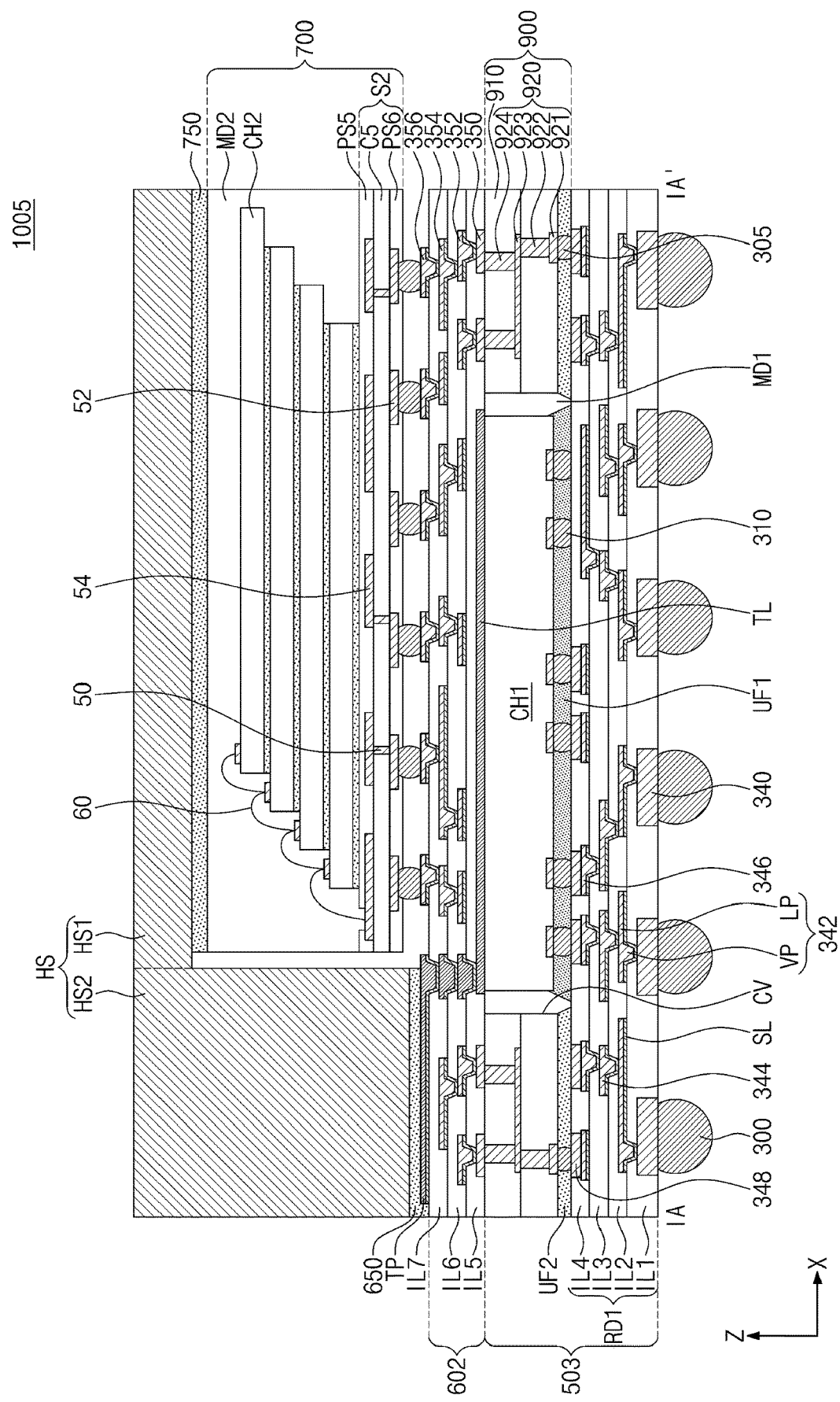
FIG. 13 illustrates a cross-sectional view taken along line IA-IA' of FIG. 1.

FIG. 13 illustrates a cross-sectional view taken along line IA-IA' of FIG. 1.

Referring to FIG. 13, a semiconductor package 1005 according to the present embodiment may include a first sub-semiconductor package 503, a wiring structure 602, a second sub-semiconductor package 700, and a thermal radiation member HS that are sequentially stacked on each other. The first sub-semiconductor package 503 may be shaped like a chip last-type fan-out panel level package (FOPLP). The first sub-semiconductor package 503 may include a first redistribution substrate RD1, a connection substrate 900 disposed on the first redistribution substrate RD1, and a first semiconductor apparatus CH1 mounted on the first redistribution substrate RD1.

The connection substrate 900 may include a cavity region CV at a center thereof. The first semiconductor apparatus CH1 may be disposed in the cavity region CV. The connection substrate 900 may include a plurality of base layers 910 and a conductive structure 920. The base layers 910 may include or may be formed of a dielectric material. For example, the base layers 910 may include or may be formed of a carbon-based material, a ceramic, or a polymer. The conductive structure 920 may include a connection pad 921, a first connection via 922, a connection line 923, and a second connection via 924. The connection substrate 900 may be connected through a fourth internal connection member 305 to the first redistribution substrate RD1. A second under-fill layer UF2 may be interposed between the connection substrate 900 and the first redistribution substrate RD1. A first mold layer MD1 may fill a space between the first semiconductor apparatus CH1 and an inner wall of the cavity region CV of the connection substrate 900. The second connection via 924 of the first sub-semiconductor package 503 may contact a second redistribution bump 350 of the wiring structure 602. The other configurations may be identical or similar to those discussed with reference to FIGS. 10 and 11.

Figure 14:
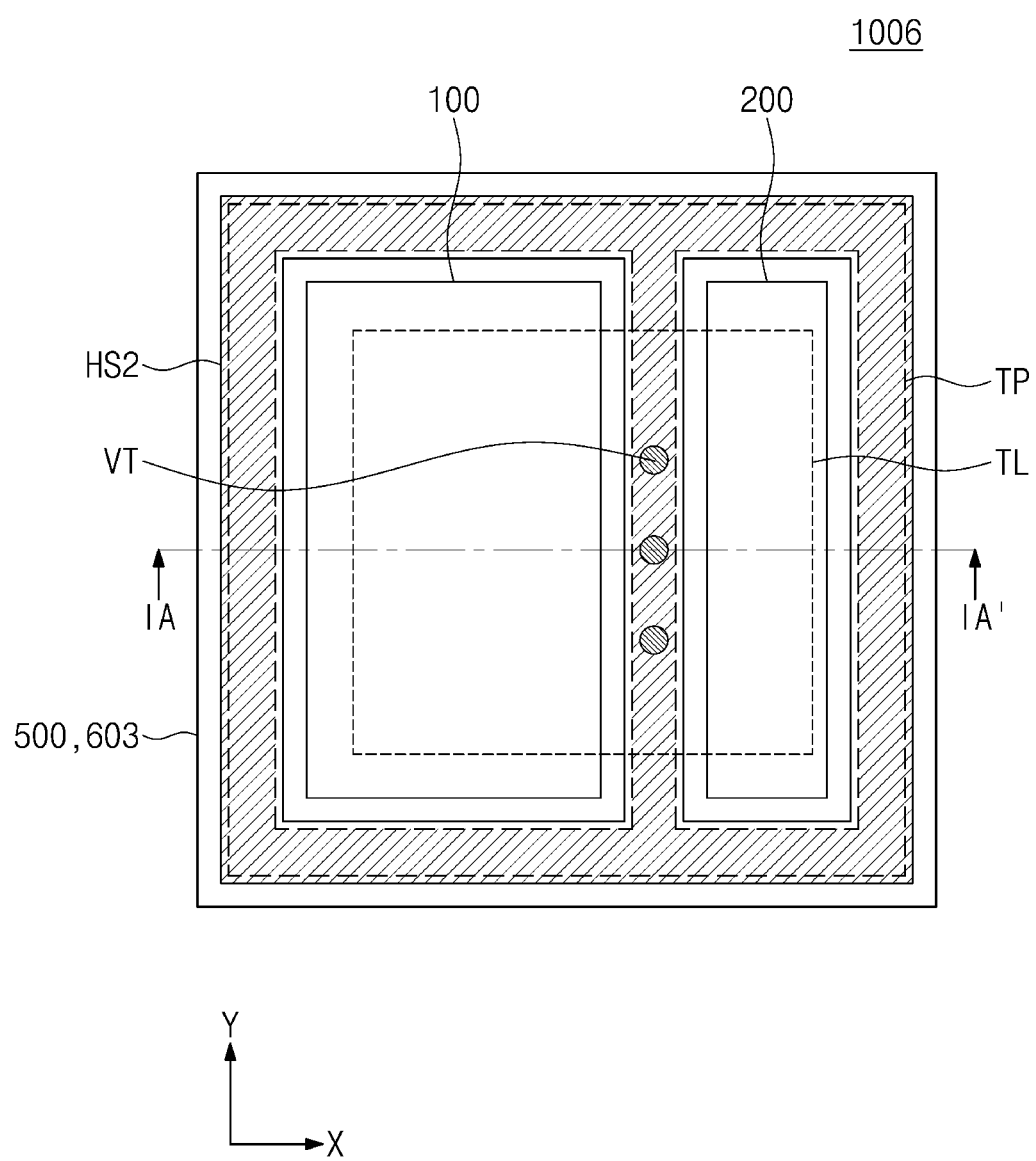
FIG. 14 illustrates a plan view showing a semiconductor package according to some example embodiments of the present inventive concepts.
Figure 15:
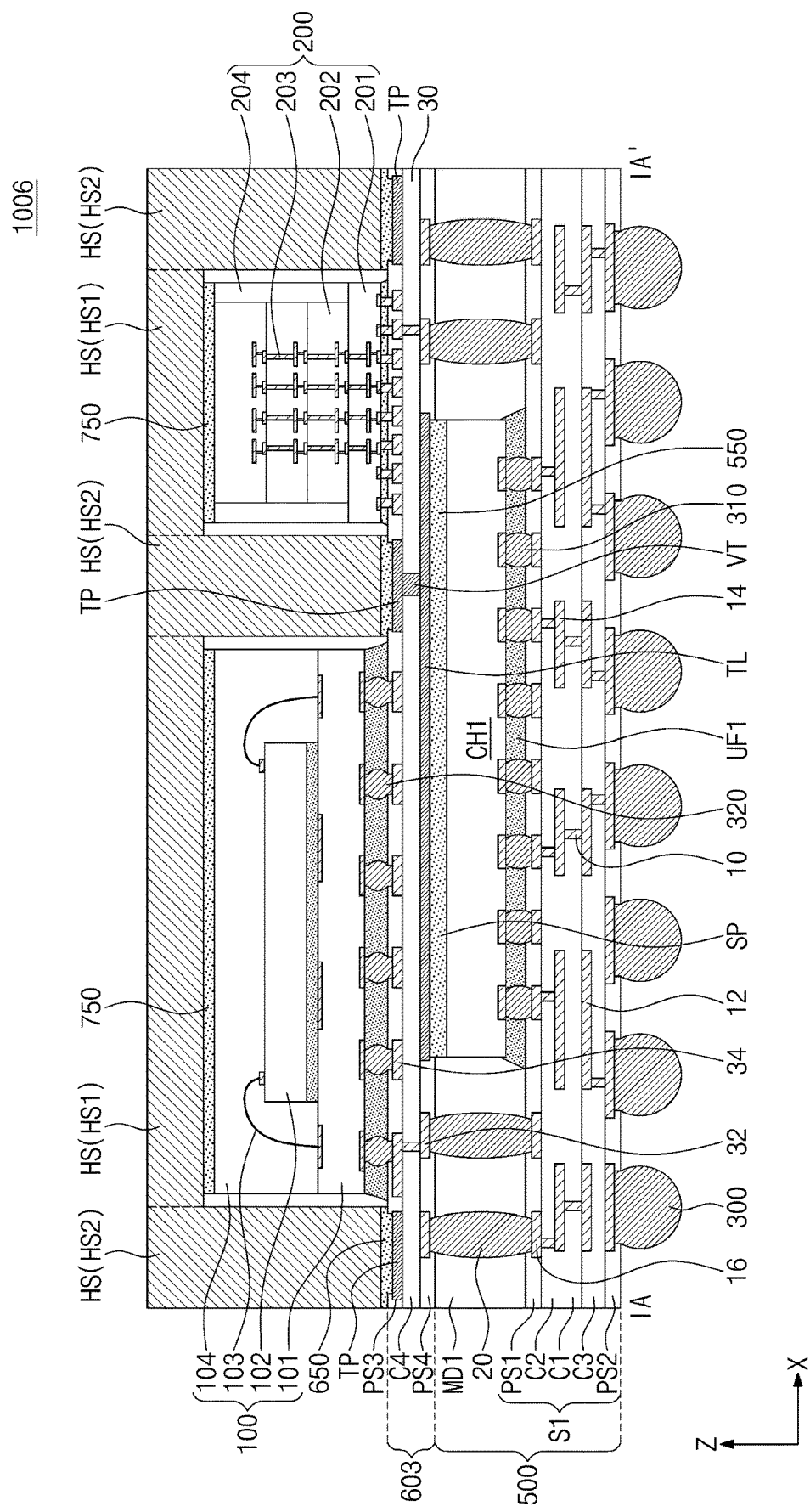
FIG. 15 illustrates a cross-sectional view taken along line IA-IA' of FIG. 14.

FIG. 14 illustrates a plan view showing a semiconductor package according to some example embodiments of the present inventive concepts. FIG. 15 illustrates a cross-sectional view taken along line IA-IA' of FIG. 14.

Referring to FIGS. 14 and 15, a semiconductor package 1006 according to the present embodiment may include a first sub-semiconductor package 500 and a wiring structure 603 that are sequentially stacked on each other. A second sub-semiconductor package 100 and a third sub-semiconductor package 200 may be disposed on the wiring structure 603, and may be spaced apart from each other in a first direction X. A thermal radiation member HS may cover the second sub-semiconductor package 100 and the third sub-semiconductor package 200. The thermal radiation member HS may include a first thermal radiation part HS1 that overlaps the second and third sub-semiconductor packages 100 and 200, and may also include a second thermal radiation part HS2 that extends toward the wiring structure 603 from a sidewall of the first thermal radiation part HS1. The second thermal radiation part HS2 may have an "8" shape when the semiconductor package 1006 is viewed in a plan view. The second thermal radiation part HS2 may also be interposed between the second sub-semiconductor package 100 and the third sub-semiconductor package 200. In an embodiment, each of the second sub-semiconductor package 100 and the third sub-semiconductor package 200 may be surrounded by the second thermal radiation part HS2.

The wiring structure 603 may include a thermal conductive pad TP that overlaps the second thermal radiation part HS2. The thermal conductive pad TP may have an "8" shape when the semiconductor package 1006 is viewed in a plan view. A plurality of thermal conductive vias VT may vertically overlap the second thermal radiation part HS2 between the second sub-semiconductor package 100 and the third sub-semiconductor package 200.

The second sub-semiconductor package 100 may include a second substrate 101, a second semiconductor chip 102 mounted on the second substrate 101 through a wire 103, and a second mold layer 104 that covers the second semiconductor chip 102. The third sub-semiconductor package 200 may include a plurality of second semiconductor chips 202 stacked on a first semiconductor chip 201. Each of the first and second semiconductor chips 201 and 202 may include a through via 203. Sidewalls of the second semiconductor chips 202 may be covered with a third mold layer 204. The third sub-semiconductor package 200 may be a high bandwidth memory (HBM) chip in which the first semiconductor chip 201 may be a logic device, and the second semiconductor chips 202 may be memory devices. A third thermal interface material layer 750 may be interposed between the first thermal radiation part HS1 and the second sub-semiconductor package 100 and between the first thermal radiation part HS1 and the third sub-semiconductor package 200. The other configurations may be identical or similar to those discussed with reference to FIGS. 1 to 4C.

FIGS. 16A to 16E illustrate plan views showing a semiconductor package according to some example embodiments of the present inventive concepts.

Figure 16A:
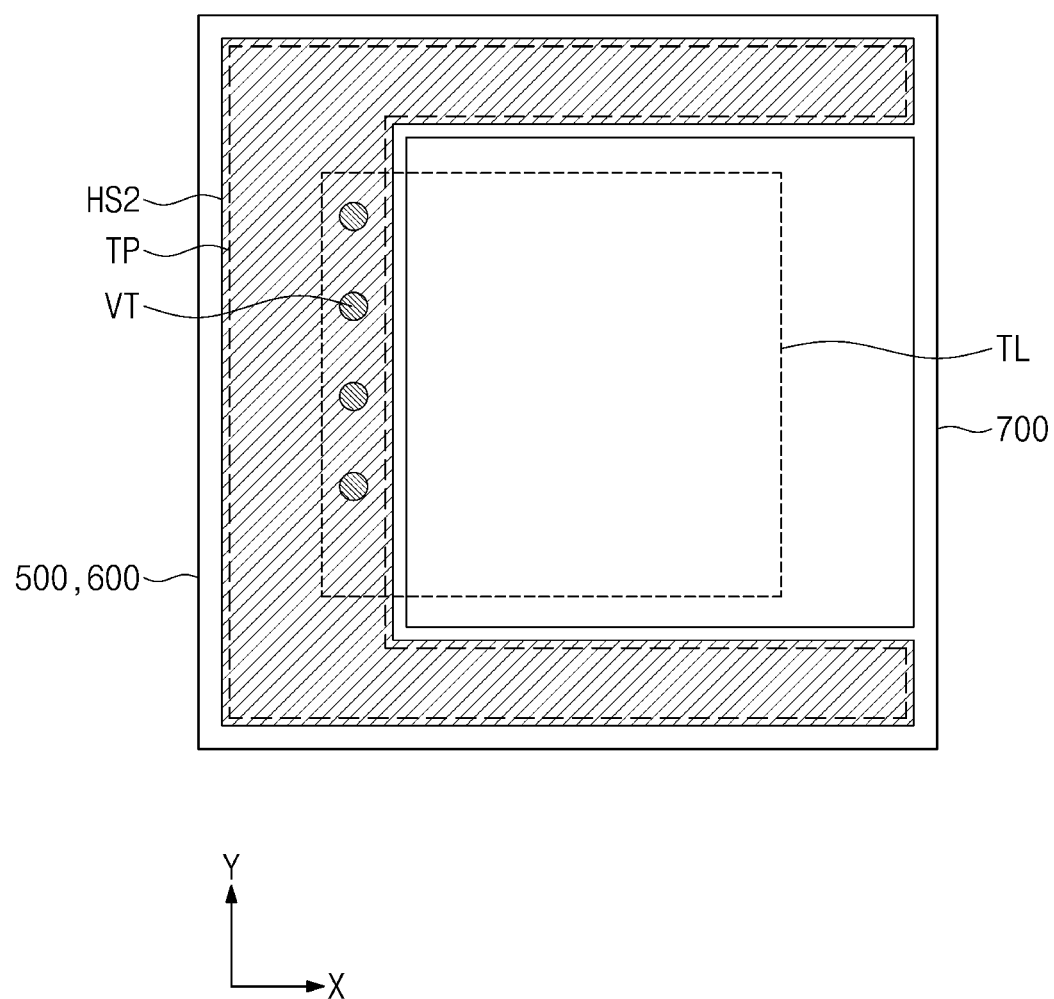
FIGS. 16A to 16E illustrate plan views showing a semiconductor package according to some example embodiments of the present inventive concepts.

Referring to FIG. 16A, a semiconductor package 1007 according to the present embodiment may be configured such that a second thermal radiation part HS2 and a thermal conductive pad TP have a "C" shape when the semiconductor package 1007 is viewed in a plan view.

Figure 16B:
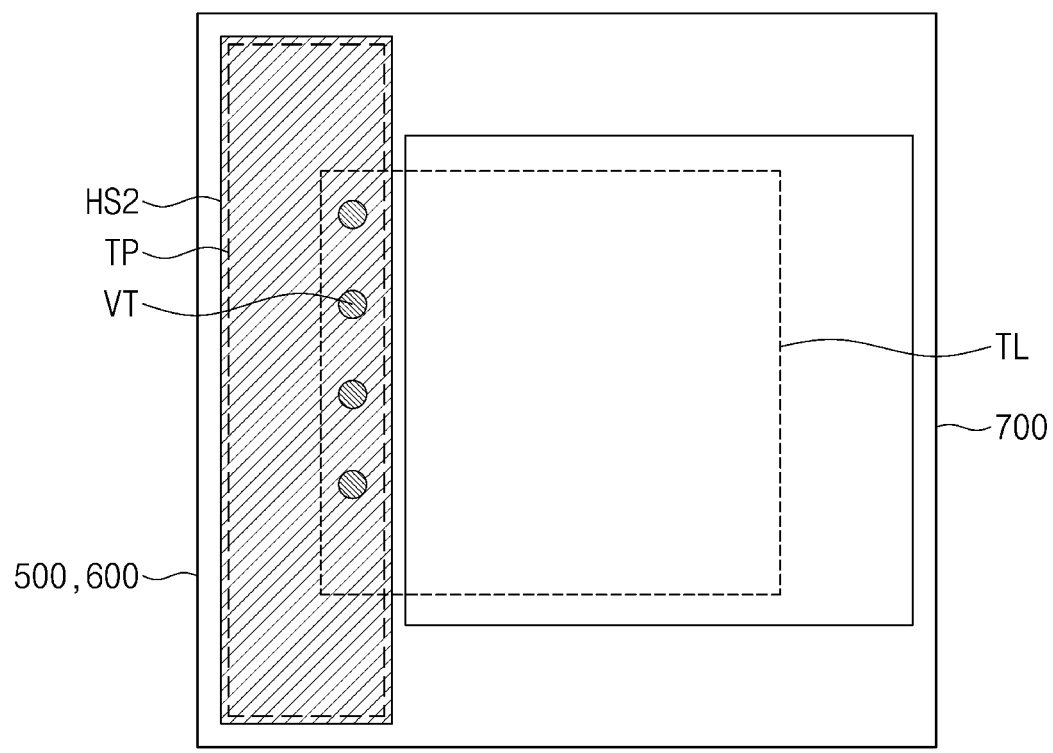

Referring to FIG. 16B, a semiconductor package 1008 according to the present embodiment may be configured such that a second thermal radiation part HS2 and a thermal conductive pad TP have an "I" shape when the semiconductor package 1008 is viewed in a plan view.

Figure 16C:
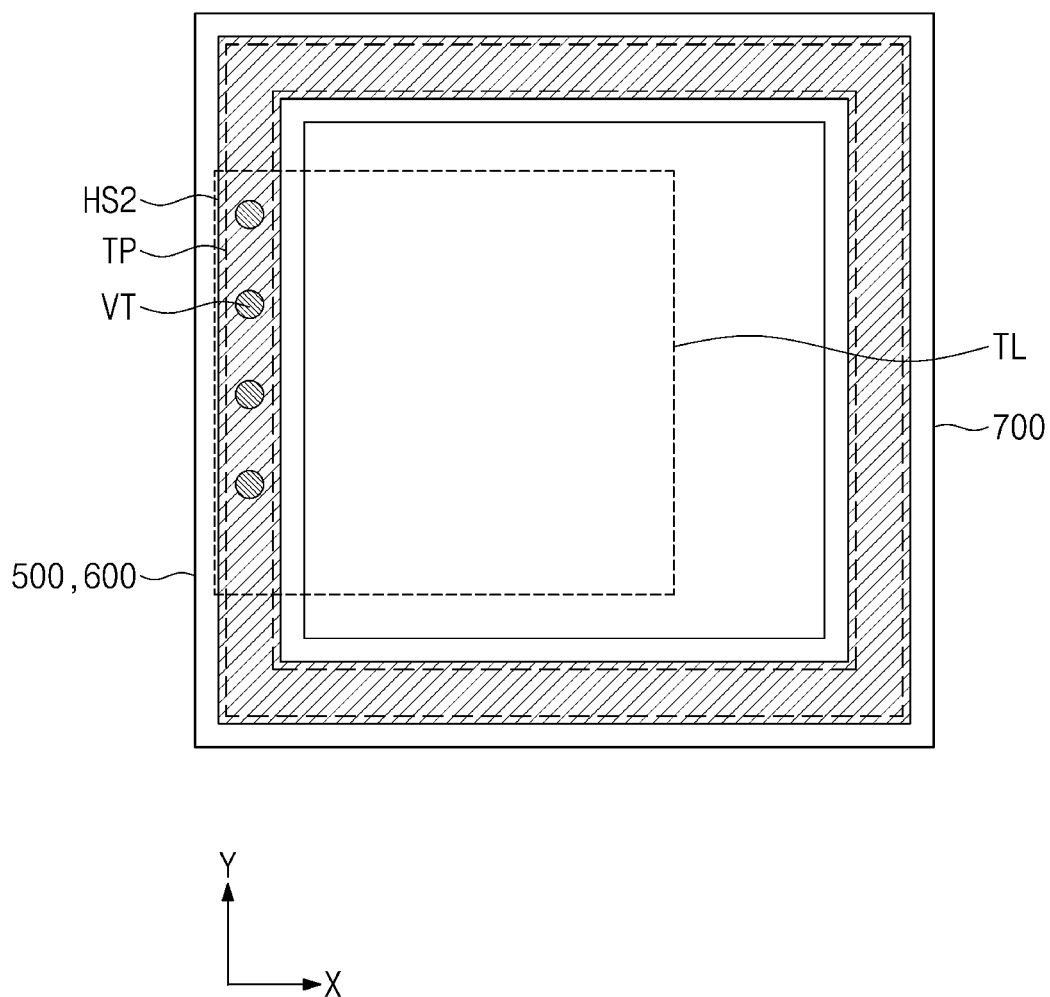

Referring to FIG. 16C, a semiconductor package 1009 according to the present embodiment may be configured such that a second thermal radiation part HS2 and a thermal conductive pad TP have an "O" shape when the semiconductor package 1009 is viewed in a plan view. The second thermal radiation part HS2 may surround a second sub-semiconductor package 700.

Figure 16D:
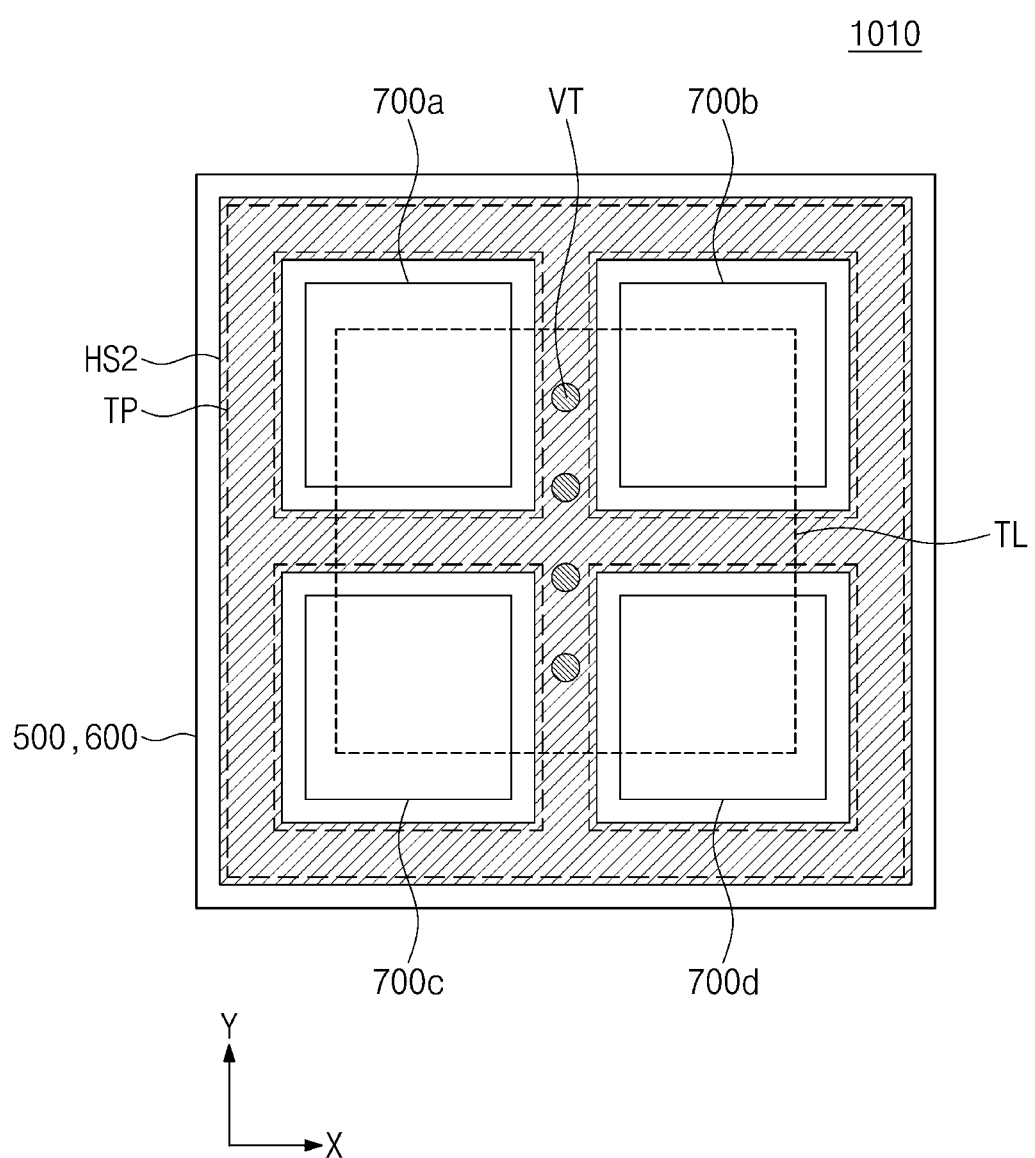

Referring to FIG. 16D, a semiconductor package 1010 according to the present embodiment may be configured such that a second thermal radiation part HS2 and a thermal conductive pad TP have a grid shape when the semiconductor package 1010 is viewed in a plan view. Second sub-semiconductor packages 700a, 700b, 700c, and 700d may be two-dimensionally arranged along a first direction X and a second direction Y. The second thermal radiation part HS2 may be interposed between the second sub-semiconductor packages 700a to 700d, while surrounding the second sub-semiconductor packages 700a to 700d.

Figure 16E:
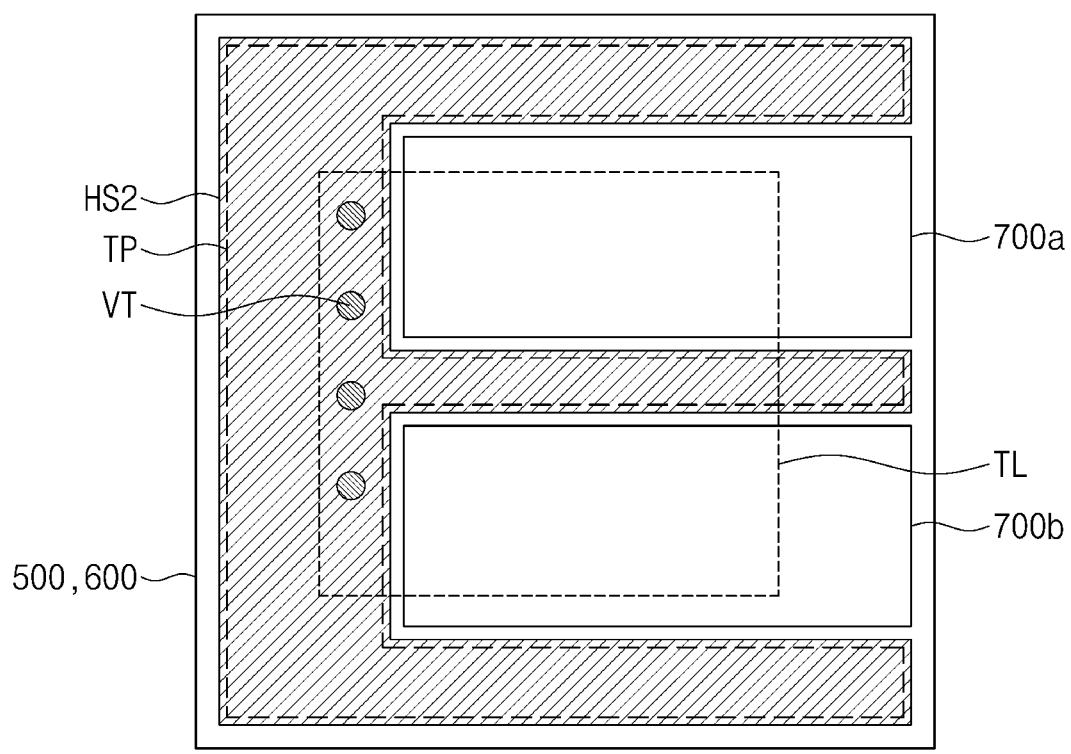

Referring to FIG. 16E, a semiconductor package 1011 according to the present embodiment may be configured such that a second thermal radiation part HS2 and a thermal conductive pad TP have a grid shape or an "E" shape when the semiconductor package 1011 is viewed in a plan view. Second sub-semiconductor packages 700a and 700b may be linearly arranged in a second direction Y different from the first direction X. The second sub-semiconductor packages 700a and 700b may be spaced apart from each other in the second direction Y. The second thermal radiation part HS2 may be interposed between the second sub-semiconductor packages 700a and 700b.

In the embodiments shown in FIGS. 16A to 16E, the other configurations except those discussed above may be identical or similar to those discussed with reference to FIGS. 1 to 15.

Figure 17A:
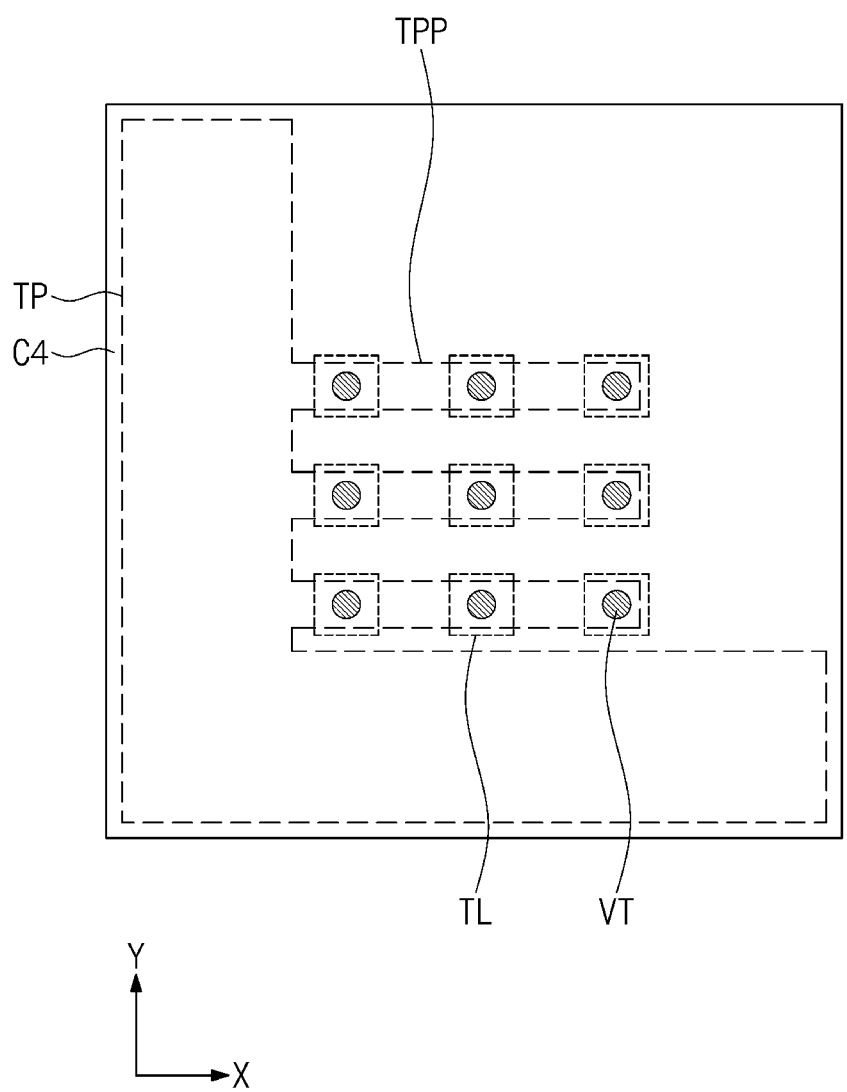
FIGS. 17A and 17B illustrate plan views showing a wiring structure according to some example embodiments of the present inventive concepts.
Figure 17B:
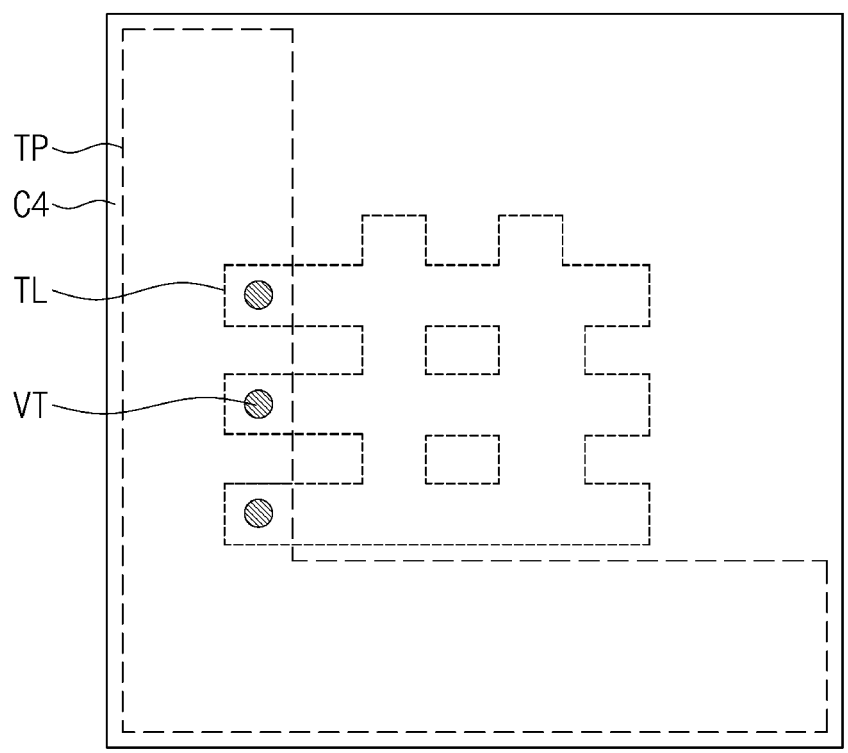

FIGS. 17A and 17B illustrate plan views showing a wiring structure according to some example embodiments of the present inventive concepts.

Referring to FIG. 17A, a wiring structure 604 according to the present embodiment may include thermal conductive layers TL having island shapes that are spaced apart from each other along a first direction X and a second direction Y. Thermal conductive vias VT may be arranged identically or similarly to the thermal conductive layers TL. A thermal conductive pad TP may include protrusions TPP that connect a plurality of thermal conductive vias VT. The other configurations may be identical or similar to those discussed with reference to FIGS. 3A and 3B.

Referring to FIG. 17B, a wiring structure 605 according to the present embodiment may include a thermal conductive layer TL that has a grid shape when the wiring structure 605 is viewed in a plan view. Although not shown, the planar shape of the thermal conductive layer TL is not limited to those illustrated in FIGS. 3A, 17A, and 17B, but may have a cross shape, a circular shape, a closed loop shape, or any other shape.

A semiconductor package according to the present inventive concepts may be configured such that a wiring structure includes a thermal conductive layer, a thermal conductive via, and a thermal conductive pad, and thus heat is discharged from a first semiconductor apparatus of a first sub-semiconductor package to a heat sink of the semiconductor package. Therefore, a reduction in speed of the first semiconductor apparatus may be prevented to avoid operating failure of the semiconductor package and thereby to increase an operating speed of the semiconductor package, which may result in an improvement in overall performance of the semiconductor package.

A wiring structure according to the present inventive concepts may include a thermal conductive via whose width is greater than those of circuit vias, which configuration may achieve an advantage of thermal radiation.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts. The embodiments of FIGS. 1 to 17B may be combined with each other.

What is claimed is:

1. A semiconductor package comprising:
a first sub-semiconductor device, an interposer, and a second sub-semiconductor device that are stacked on each other so that the interposer is configured to connect the first sub-semiconductor device and the second sub-semiconductor device with each other; and
a heat sink covering the second sub-semiconductor device,
wherein the first sub-semiconductor device includes a first substrate and a first semiconductor chip that is stacked on the first substrate,
wherein the interposer includes:
a dielectric layer,
a thermal conductive layer in contact with a bottom surface of the dielectric layer,
a first thermal conductive pad in contact with a top surface of the dielectric layer, and
a plurality of thermal conductive vias that penetrate the dielectric layer and connect the thermal conductive layer to the first thermal conductive pad,
wherein a bottom surface of the thermal conductive layer is adjacent to and connected to a top surface of the first semiconductor chip,
wherein the second sub-semiconductor device is disposed on the dielectric layer of the interposer without overlapping the first thermal conductive pad of the interposer, and wherein the heat sink further covers the first thermal conductive pad of the interposer connected thereto.

2. The semiconductor package of claim 1, further comprising:
a first thermal interface material layer between the first sub-semiconductor device and the interposer,
wherein the first thermal interface material layer is in contact with the thermal conductive layer and the first semiconductor chip.

3. The semiconductor package of claim 2,
wherein the first thermal interface material layer has a thickness having a value from about 5 μm to about 40 μm.

4. The semiconductor package of claim 3,
wherein the first sub-semiconductor device further includes:
a first mold layer that covers a sidewall of the first semiconductor chip and a top surface of the first substrate, and
wherein the first mold layer covers a sidewall of the first thermal interface material layer.

5. The semiconductor package of claim 4,
wherein a portion of the first thermal interface material layer outwardly protrudes beyond a sidewall of the first semiconductor chip, and
wherein an upper sidewall of the first mold layer has a recessed region in contact with the first thermal interface material layer.

6. The semiconductor package of claim 2,
wherein the interposer further includes:
a first lower passivation layer that covers the bottom surface of the dielectric layer and exposes the thermal conductive layer, and
wherein the first thermal interface material layer penetrates the first lower passivation layer and contacts the thermal conductive layer.

7. The semiconductor package of claim 1,
wherein the interposer further includes:
a plurality of first upper conductive patterns in contact with the top surface of the dielectric layer;
a plurality of first lower conductive patterns in contact with the bottom surface of the dielectric layer; and
a plurality of first circuit vias that penetrates the dielectric layer,
wherein each of the plurality of first circuit vias connects a corresponding one of the plurality of first upper conductive patterns to a corresponding one of the plurality of first lower conductive patterns, and
wherein a first width, in a first direction parallel to the bottom surface of the dielectric layer of the interposer, of each of the plurality of thermal conductive vias is greater than a second width, in the first direction, of each of the plurality of first circuit vias.

8. The semiconductor package of claim 7,
wherein the first width has a value from about 100 μm to about 250 μm, and
wherein the second width has a value from about 1 μm to about 70 μm.

9. The semiconductor package of claim 1,
wherein the heat sink includes:
a first heat sink part that overlaps the second sub-semiconductor device; and
a second heat sink part that extends toward the interposer from a sidewall of the first heat sink part, and
wherein a width of the second heat sink part has a value from about 500 μm to about 7,000 μm.

10. The semiconductor package of claim 1,
wherein the heat sink includes:
a first heat sink part that overlaps the second sub-semiconductor device; and
a second heat sink part that extends toward the interposer from a sidewall of the first heat sink part,
wherein when the semiconductor package is viewed in a plan view, the second heat sink part has an "I" shape, an "L" shape, a "C" shape, an "E" shape, an "O" shape, an "8" shape, or a grid shape.

11. The semiconductor package of claim 1,
wherein the heat sink includes:
a first heat sink part that overlaps the second sub-semiconductor device; and
a second heat sink part that extends toward the interposer from a sidewall of the first heat sink part, and
wherein the second heat sink part is thicker than the first heat sink part.

12. The semiconductor package of claim 1,
wherein a width of the first thermal conductive pad has a value from about 500 μm to about 7,000 μm.

13. The semiconductor package of claim 1,
wherein when the semiconductor package is viewed in a plan view, the first thermal conductive pad has an "I" shape, an "L" shape, a "C" shape, an "E" shape, an "O" shape, an "8" shape, or a grid shape.

14. The semiconductor package of claim 1,
wherein the interposer further includes:
a first lower passivation layer that covers the bottom surface of the dielectric layer and exposes the thermal conductive layer; and
a dielectric support pattern that contacts the first lower passivation layer and the first semiconductor chip.

15. The semiconductor package of claim 14, further comprising:
a first thermal interface material layer between the interposer and the first sub-semiconductor device,
wherein the first thermal interface material layer is between the dielectric support pattern and the first semiconductor chip of the first sub-semiconductor device.

16. The semiconductor package of claim 1, further comprising:
a third sub-semiconductor device on the interposer and next to the second sub-semiconductor device,
wherein the interposer further includes:
a second thermal conductive pad in contact with a portion of the dielectric layer, the portion of the dielectric layer being disposed between the second and third sub-semiconductor devices, and
wherein a portion of the heat sink covers the second thermal conductive pad to be connected thereto.

17. The semiconductor package of claim 1,
wherein each of the plurality of thermal conductive vias includes a plurality of sub-vias that are stacked on each other.

18. The semiconductor package of claim 1,
wherein the first substrate has a first thickness,
wherein the interposer has a second thickness, and
wherein the second thickness is less than the first thickness.

19. A semiconductor package comprising:
a first sub-semiconductor device;
an interposer on the first sub-semiconductor device;
a first thermal interface material layer between the first sub-semiconductor device and the interposer;

a second sub-semiconductor device on the interposer, the second sub-semiconductor device exposing a portion of the interposer;

a heat sink that covers a top surface of the second sub-semiconductor device, a sidewall of the second sub-semiconductor device and the portion of the interposer; and a second thermal interface material layer between the heat sink and the portion of the interposer, wherein the first sub-semiconductor device includes a first substrate and a first semiconductor chip that is stacked on the first substrate, wherein the interposer includes:
 a dielectric layer;
 a thermal conductive layer in contact with a bottom surface of the dielectric layer;
 a thermal conductive pad in contact with a top surface of the dielectric layer; and
 a plurality of thermal conductive vias that penetrate the dielectric layer and connect the thermal conductive layer to the thermal conductive pad, wherein the second sub-semiconductor device exposes the thermal conductive pad of the interposer, wherein the first thermal interface material layer is in contact with a bottom surface of the thermal conductive layer and a top surface of the first semiconductor chip, wherein the second thermal interface material layer is in contact with a top surface of the thermal conductive pad and the bottommost surface of the heat sink, and wherein the thermal conductive pad has a width having a value from about 500 μm to about 7,000 μm.

20. A semiconductor package comprising a first sub-semiconductor device, an interposer, and a second sub-semiconductor device that are stacked on each other so that the interposer is configured to connect the first sub-semiconductor device and the second sub-semiconductor device with each other, wherein the interposer includes:
 a dielectric layer,
 a thermal conductive layer and a plurality of lower conductive patterns that are in contact with a bottom surface of the dielectric layer and are spaced apart from each other, wherein a bottom surface of the thermal conductive layer is adjacent to and connected to a top surface of the first sub-semiconductor device,
 a thermal conductive pad and a plurality of upper conductive patterns that are in contact with a top surface of the dielectric layer and are spaced apart from each other,
 a plurality of thermal conductive vias that penetrate the dielectric layer and connect the thermal conductive layer to the thermal conductive pad, and
 a plurality of circuit vias that penetrate the dielectric layer, wherein each of the plurality of circuit vias connects a corresponding one of the plurality of upper conductive patterns to a corresponding one of the plurality of lower conductive patterns, wherein the second sub-semiconductor device is disposed on the dielectric layer of the interposer without overlapping the thermal conductive pad of the interposer, and wherein a first width, in a first direction parallel to the bottom surface of the dielectric layer, of each of the plurality of thermal conductive vias is greater than a second width, in the first direction, of each of the plurality of circuit vias.

* * * * *